United States Patent
Ikeda et al.

(10) Patent No.: US 11,563,386 B2
(45) Date of Patent: Jan. 24, 2023

(54) ELECTROMECHANICAL TRANSDUCER AND METHOD FOR MANUFACTURING SAME

(71) Applicant: CITIZEN WATCH CO., LTD., Tokyo (JP)

(72) Inventors: Tomoo Ikeda, Saitama (JP); Izumi Yamamoto, Saitama (JP); Takuya Shirai, Tokyo (JP); Yudai Hoshi, Saitama (JP)

(73) Assignee: CITIZEN WATCH CO., LTD., Tokyo (JP)

( * ) Notice: Subject to any disclaimer, the term of this patent is extended or adjusted under 35 U.S.C. 154(b) by 100 days.

(21) Appl. No.: 16/980,832

(22) PCT Filed: Oct. 5, 2018

(86) PCT No.: PCT/JP2018/037475
§ 371 (c)(1),
(2) Date: Sep. 14, 2020

(87) PCT Pub. No.: WO2019/181026
PCT Pub. Date: Sep. 26, 2019

(65) Prior Publication Data
US 2021/0367535 A1    Nov. 25, 2021

(30) Foreign Application Priority Data
Mar. 19, 2018   (JP) .............. JP2018-051205

(51) Int. Cl.
*H02N 1/08*    (2006.01)
*H02N 1/00*    (2006.01)
*B81B 3/00*    (2006.01)

(52) U.S. Cl.
CPC .......... *H02N 1/002* (2013.01); *B81B 3/0086* (2013.01); *H02N 1/08* (2013.01)

(58) Field of Classification Search
CPC . H02N 1/08; H02N 1/00; H02N 1/002; B81B 3/0086
See application file for complete search history.

(56) References Cited

U.S. PATENT DOCUMENTS 8,384,267 B2 *   2/2013  Naruse .............. H02N 1/08
                                                310/309
8,841,816 B2 *   9/2014  Masaki ............. H01G 7/02
                                                310/309
(Continued)

FOREIGN PATENT DOCUMENTS

JP   2008-277473 A    11/2008
JP   2011-91996 A      5/2011
(Continued)

OTHER PUBLICATIONS

English Machine Translation, Takahashi et al., JP 2017-163817. (Year: 2017).*
(Continued)

*Primary Examiner* — Burton S Mullins

(57) ABSTRACT

Provided are an electromechanical transducer including a light movable member that is easy to move and charged portions whose amount of electrostatic charge does not substantially change over time and a method for manufacturing such an electromechanical transducer. The electromechanical transducer using electrostatic interaction between a charged portion and a counter electrode to perform transduction between electric power and motive power includes a fixed substrate, a movable member being movable with a predetermined distance maintained between the fixed substrate and the movable member, the movable member having grooves in a surface facing the fixed substrate, the grooves being formed at intervals in a moving direction of the movable member, charged portions formed on the surface of the movable member so as to alternate with the (Continued)

grooves; counter electrodes disposed on a surface of the fixed substrate in the moving direction, the surface facing the movable member, and a cover layer containing copper and covering at least side walls of the movable member inside the grooves.

20 Claims, 17 Drawing Sheets

(56) References Cited

U.S. PATENT DOCUMENTS

| | | |
|---|---|---|
| 2008/0265686 A1 | 10/2008 | Matsubara et al. |
| 2009/0051242 A1 | 2/2009 | Suzuki et al. |
| 2009/0243429 A1* | 10/2009 | Naruse ............... H02N 1/002 310/309 |
| 2013/0241346 A1 | 9/2013 | Boisseau |
| 2014/0145554 A1* | 5/2014 | Takeuchi ............ H02N 1/08 310/309 |
| 2014/0340376 A1 | 11/2014 | Itagaki et al. |

FOREIGN PATENT DOCUMENTS

| | | |
|---|---|---|
| JP | 2013-64921 A | 4/2013 |
| JP | 2014-107890 A | 6/2014 |
| JP | 2014-217178 A | 11/2014 |
| JP | 2016-46837 A | 4/2016 |
| JP | 2017-28910 A | 2/2017 |
| JP | 2017-163817 A | 9/2017 |

OTHER PUBLICATIONS

WIPO, International Search Report for the International Patent Application No. PCT/JP2018/037475, dated Jan. 15, 2019.
WIPO, Written Opinion for the International Patent Application No. PCT/JP2018/037475, dated Jan. 15, 2019.

* cited by examiner

FIG. 2
(A)
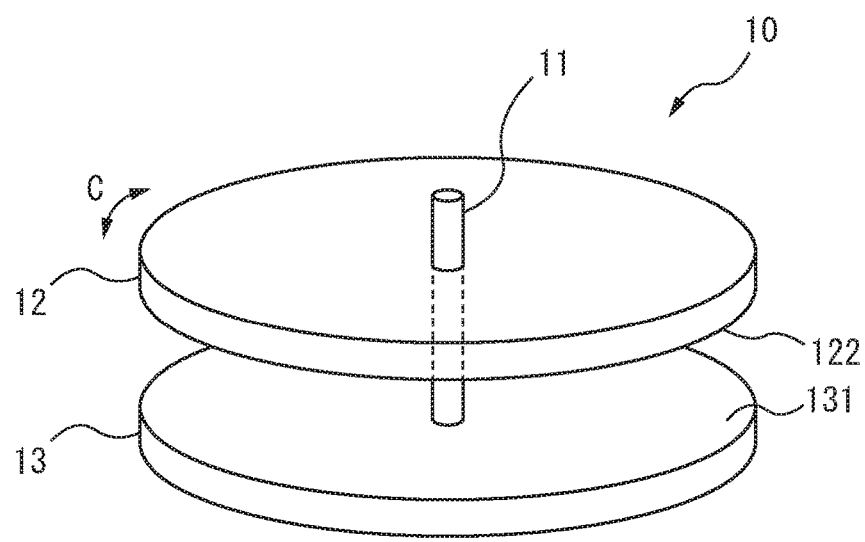
(B)
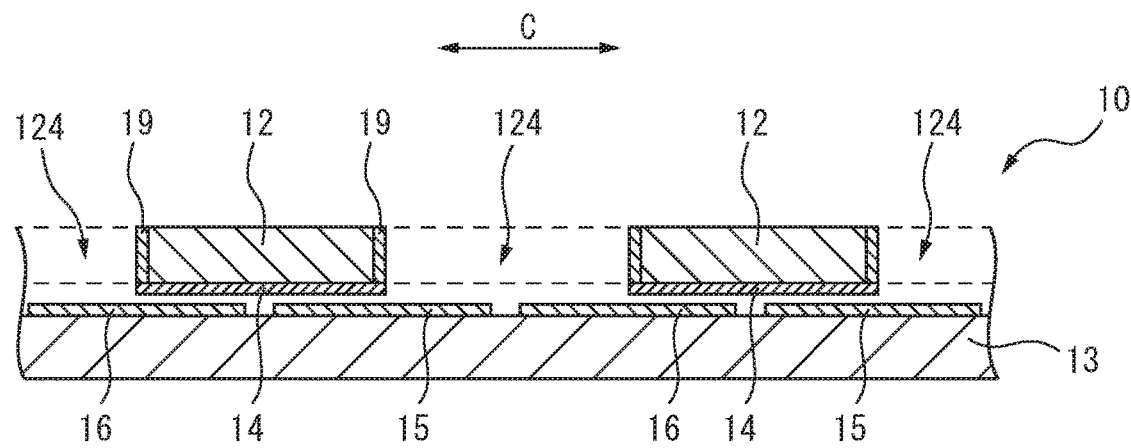

FIG. 4
(A) 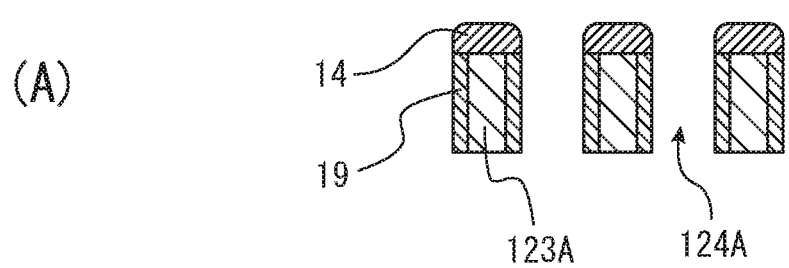
(B) 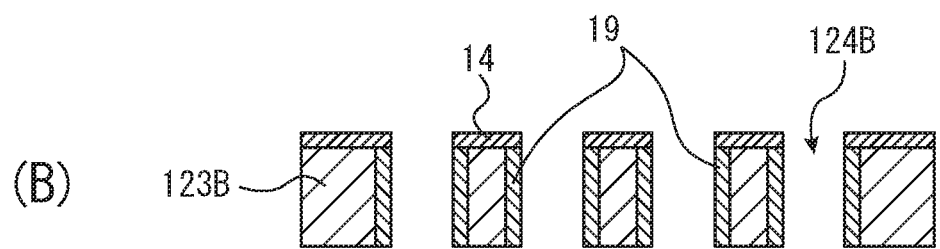
(C) 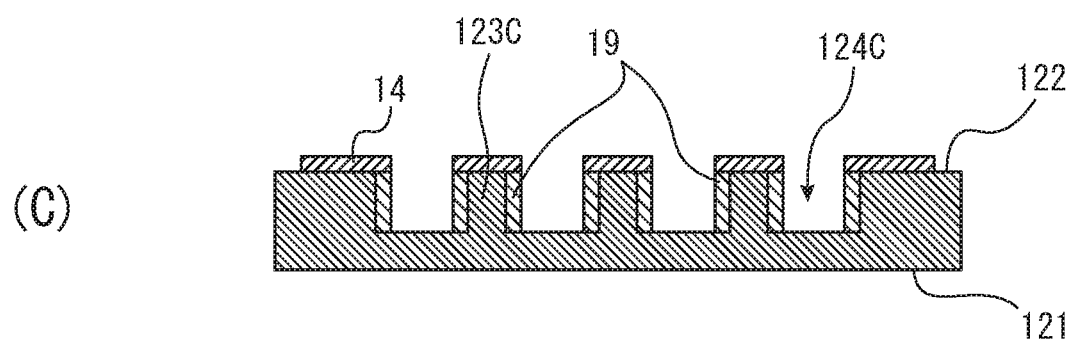

FIG. 5
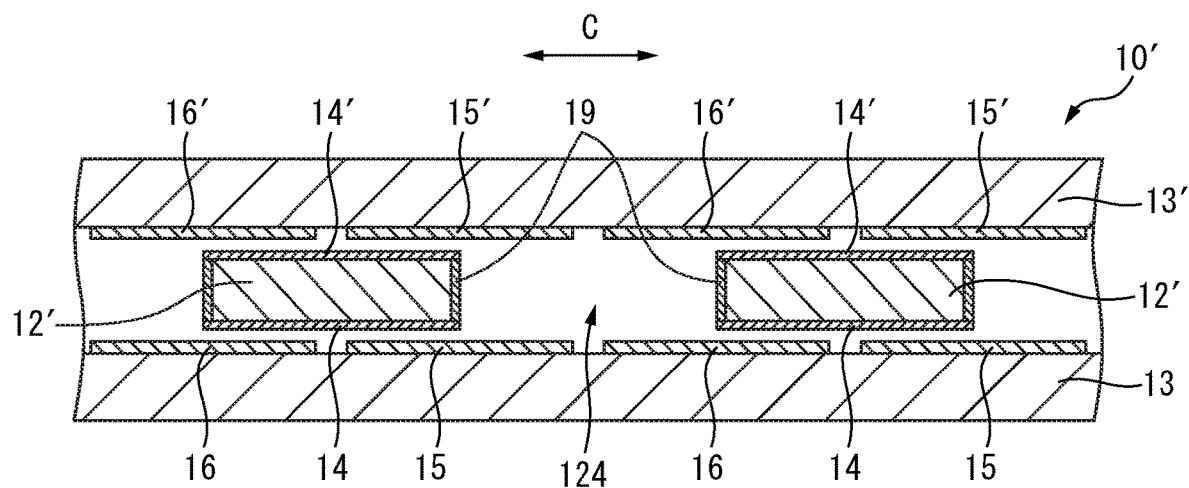
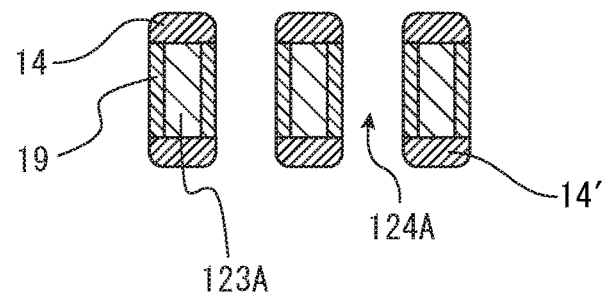

FIG. 8
(A) 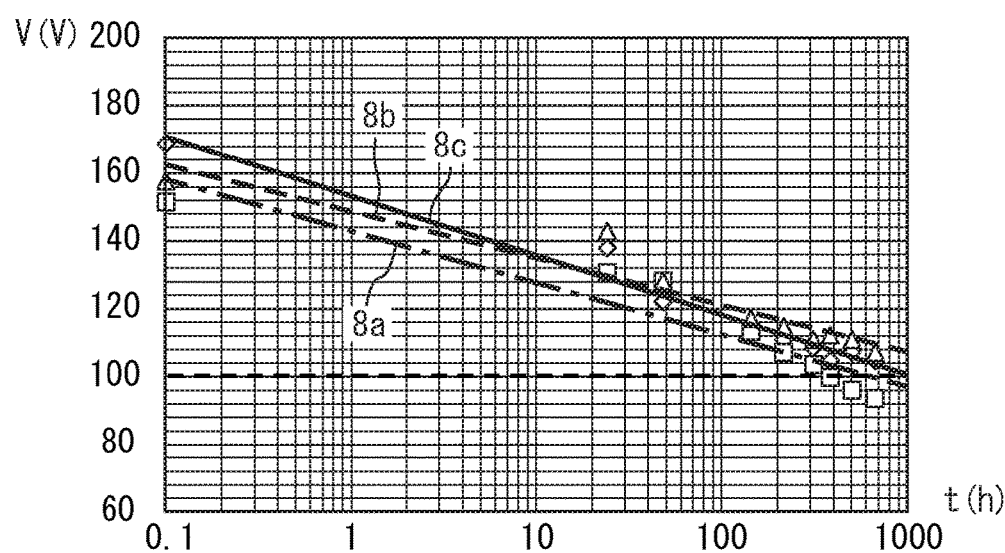
(B) 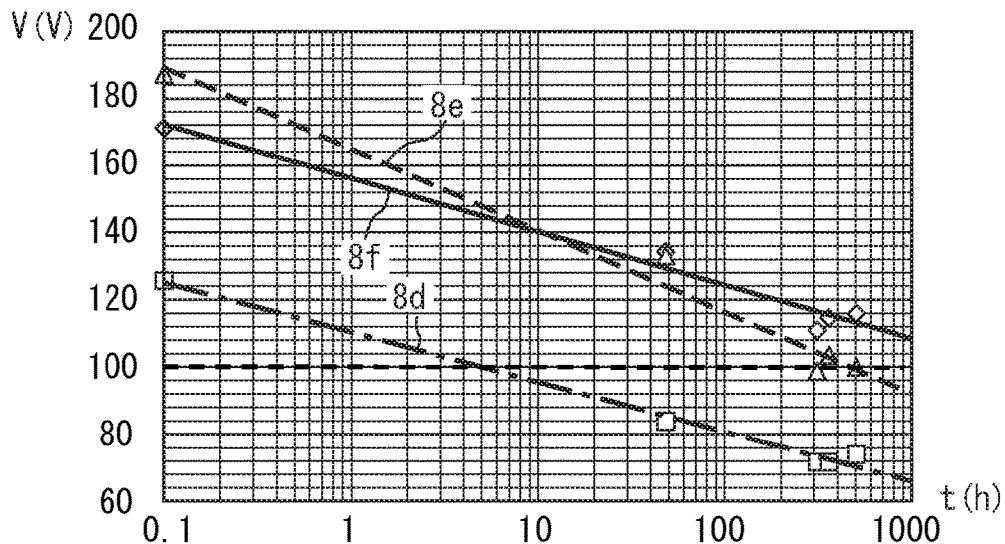
(C) 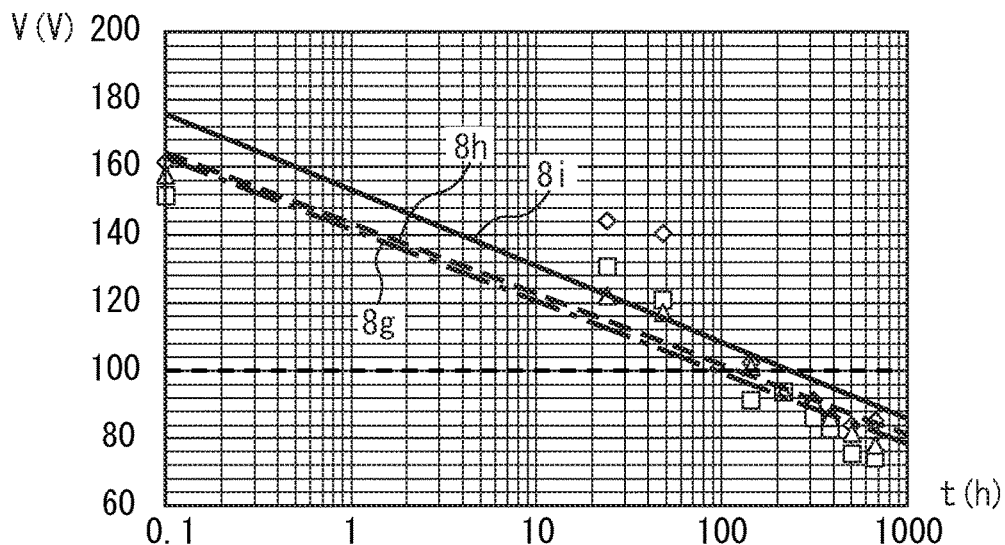

FIG. 9
(A) 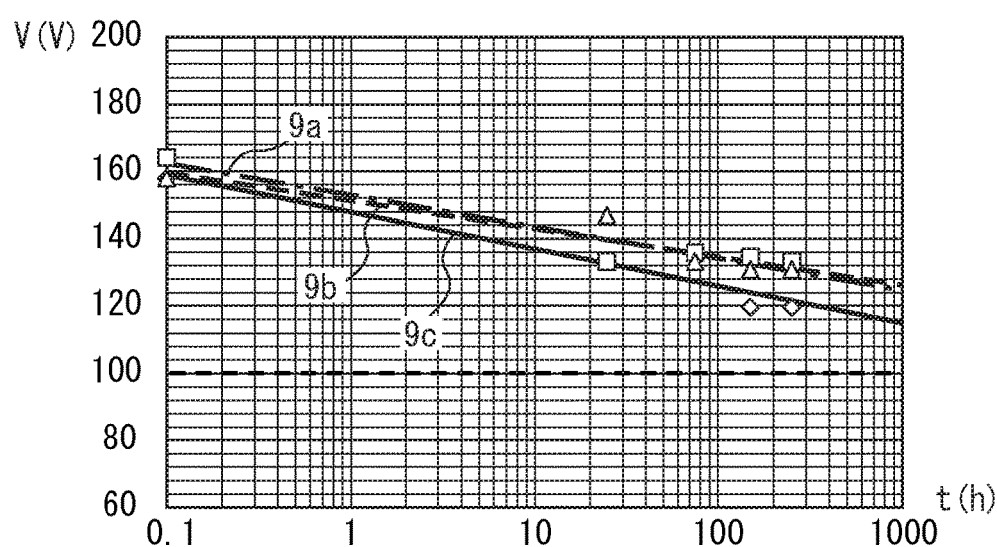
(B) 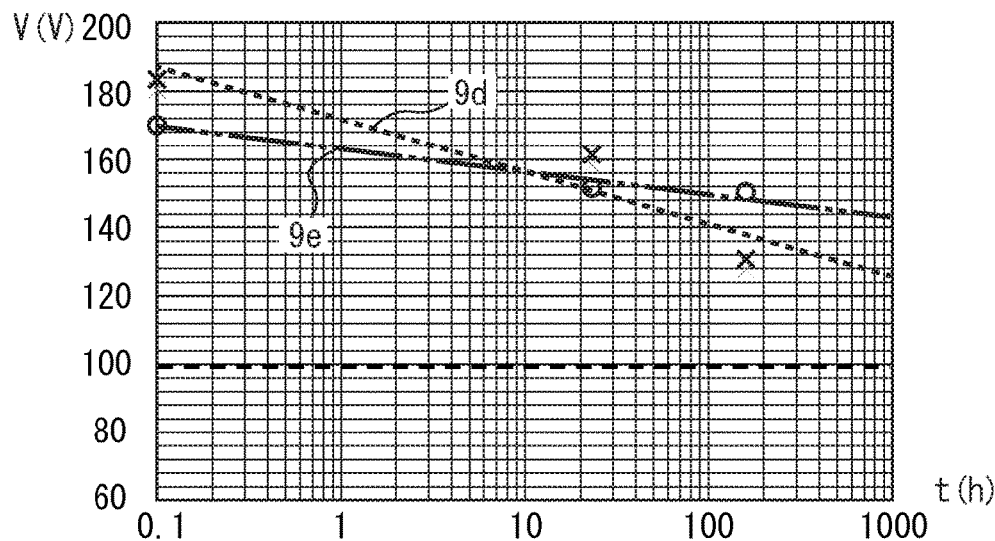
(C) 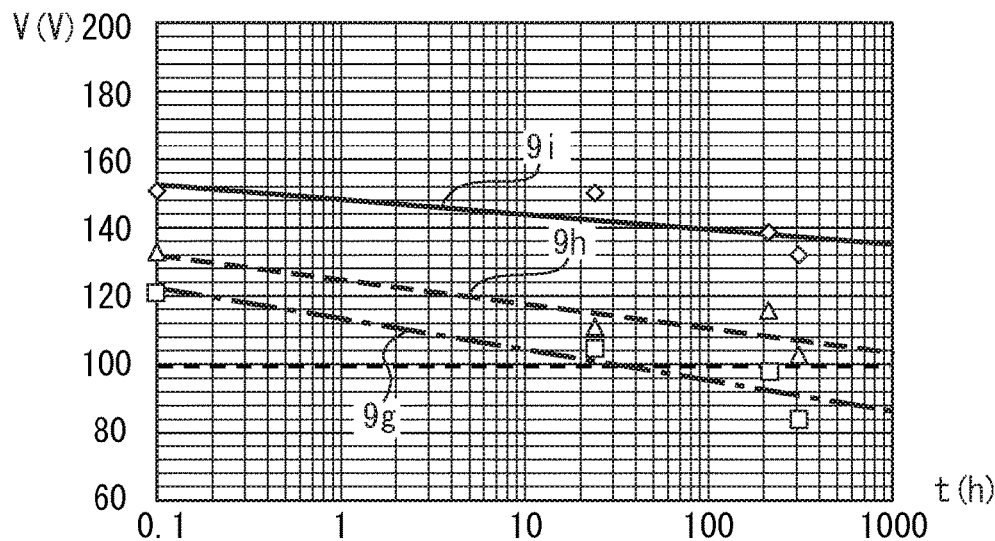

FIG. 10
(A) 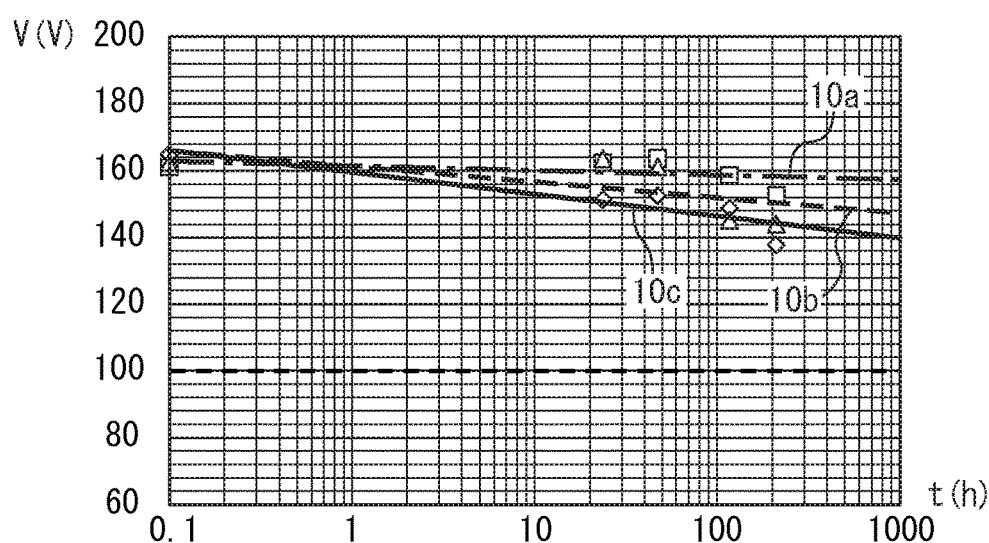
(B) 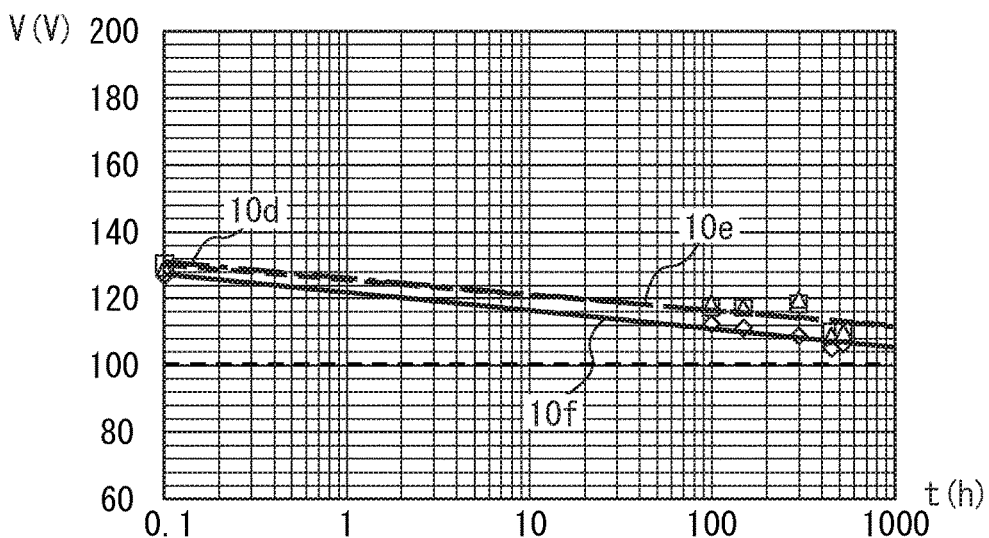
(C) 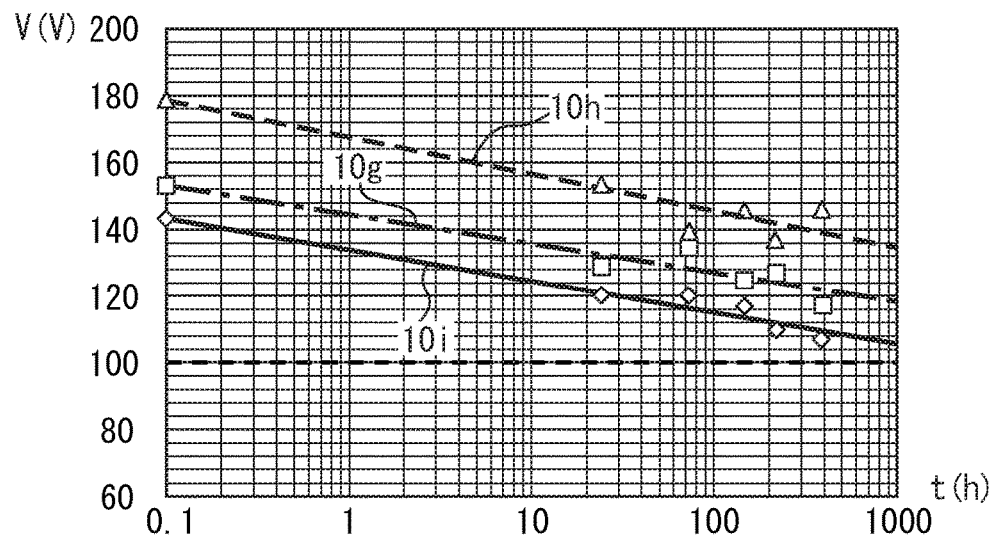

FIG. 11
(A)
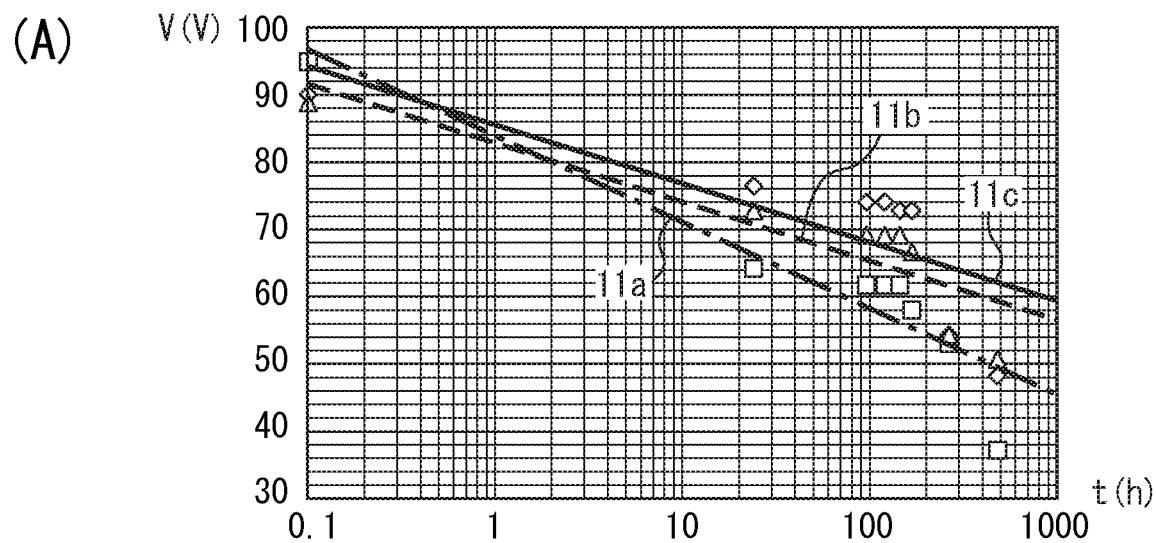
(B)
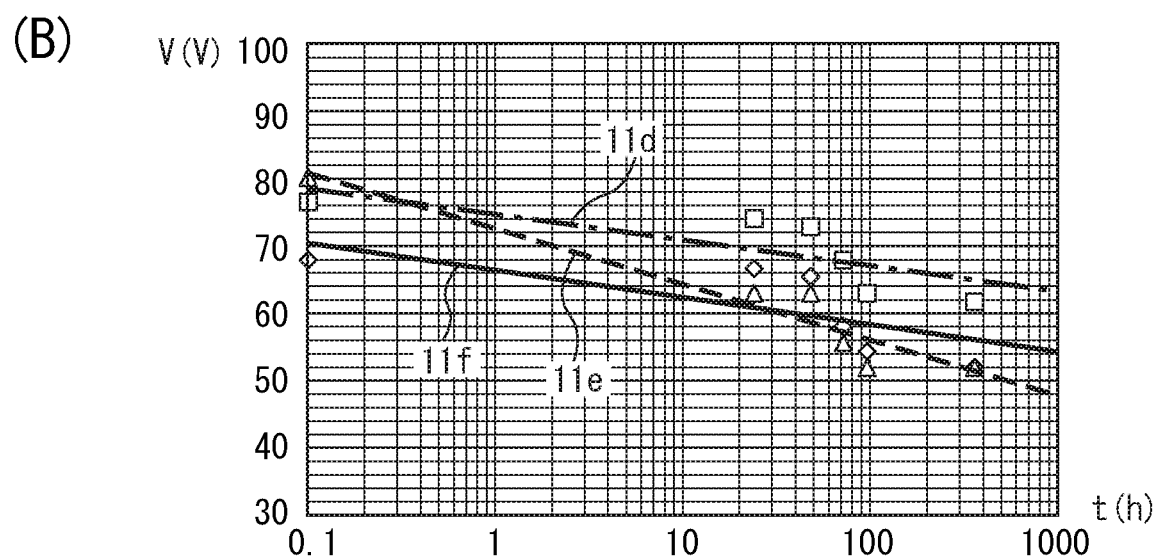

FIG. 12
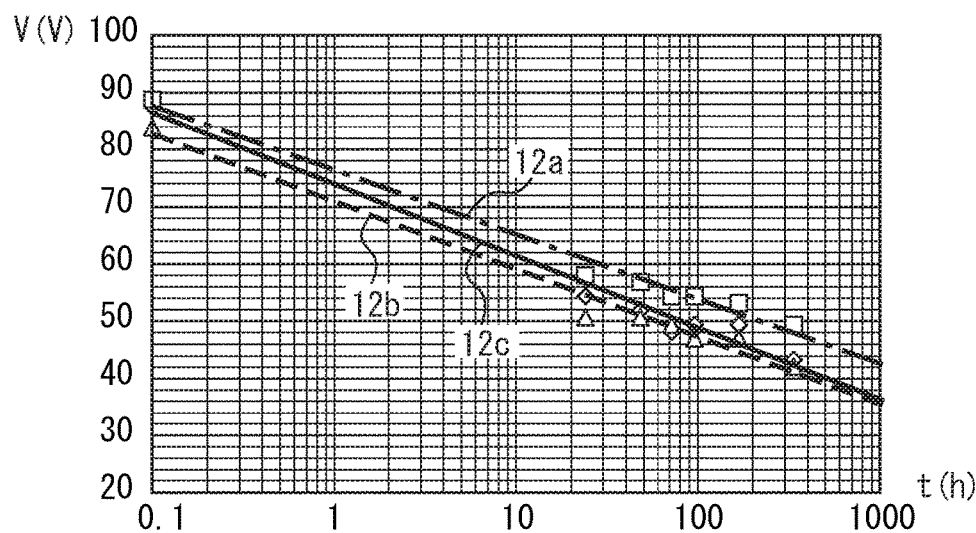
(A)
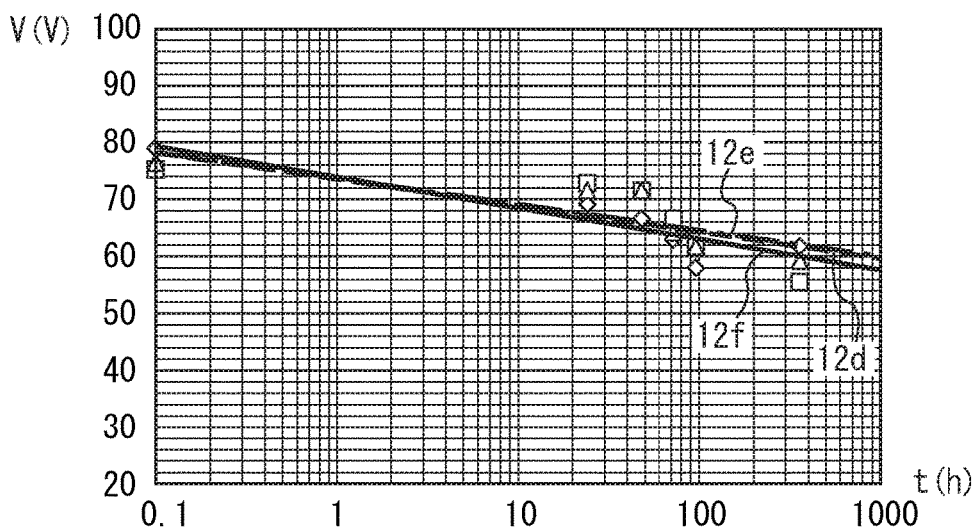
(B)
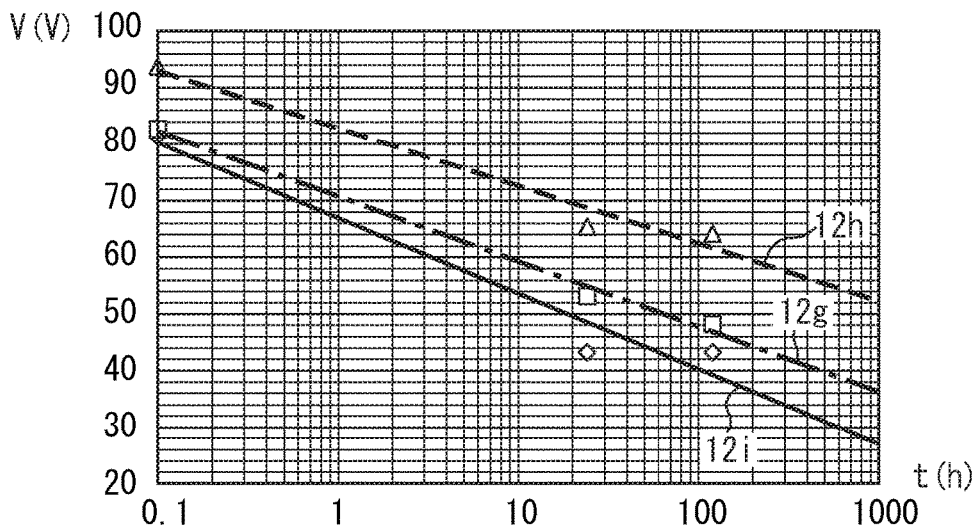
(C)

FIG. 13
(A) 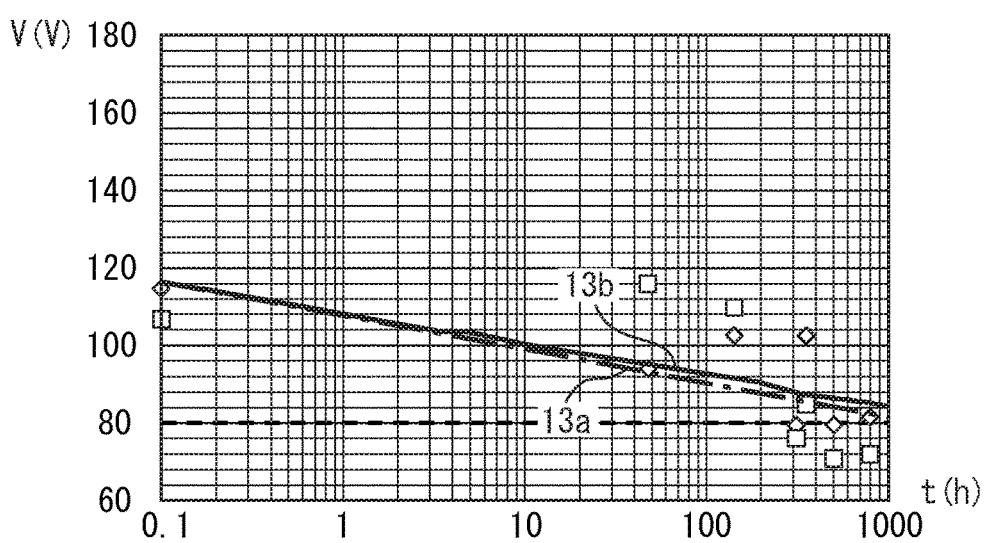
(B) 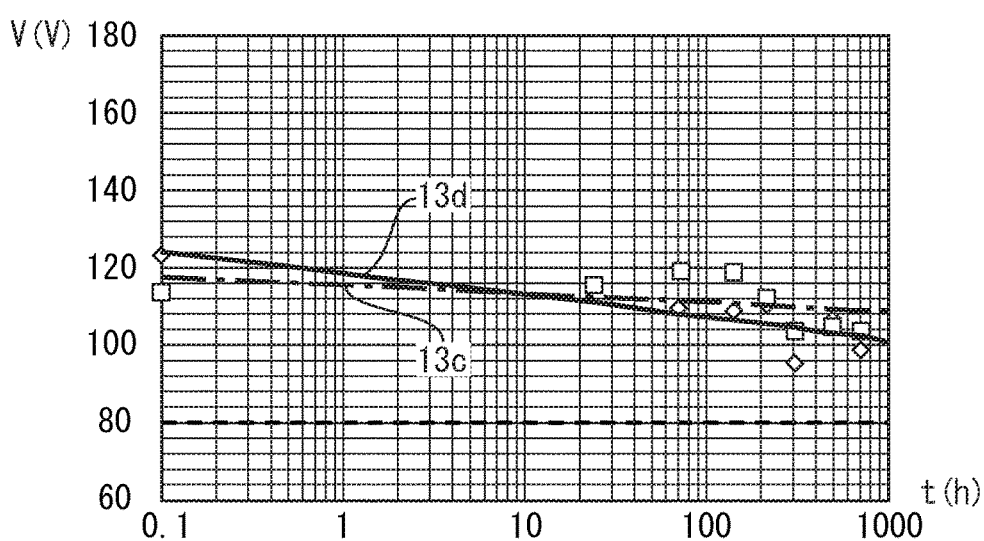
(C) 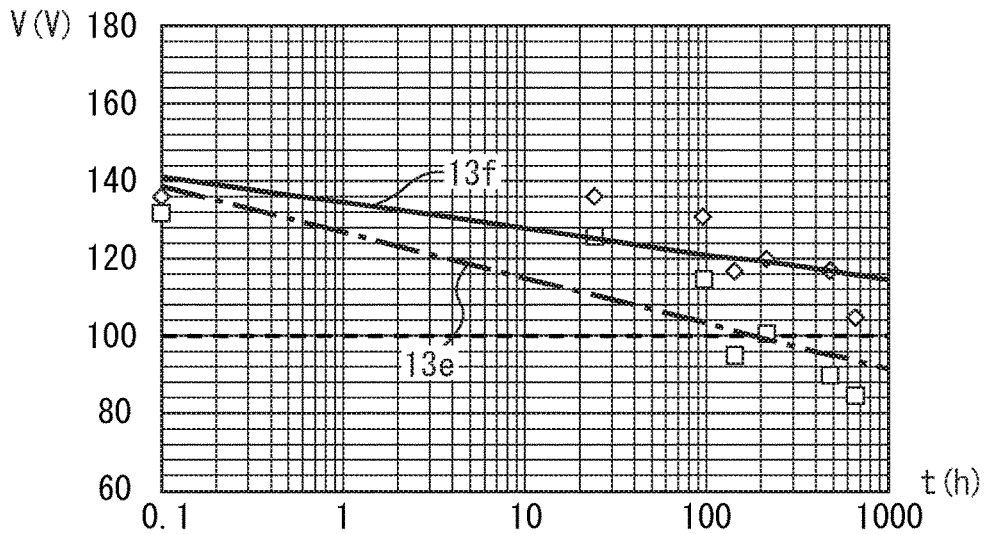

FIG. 17
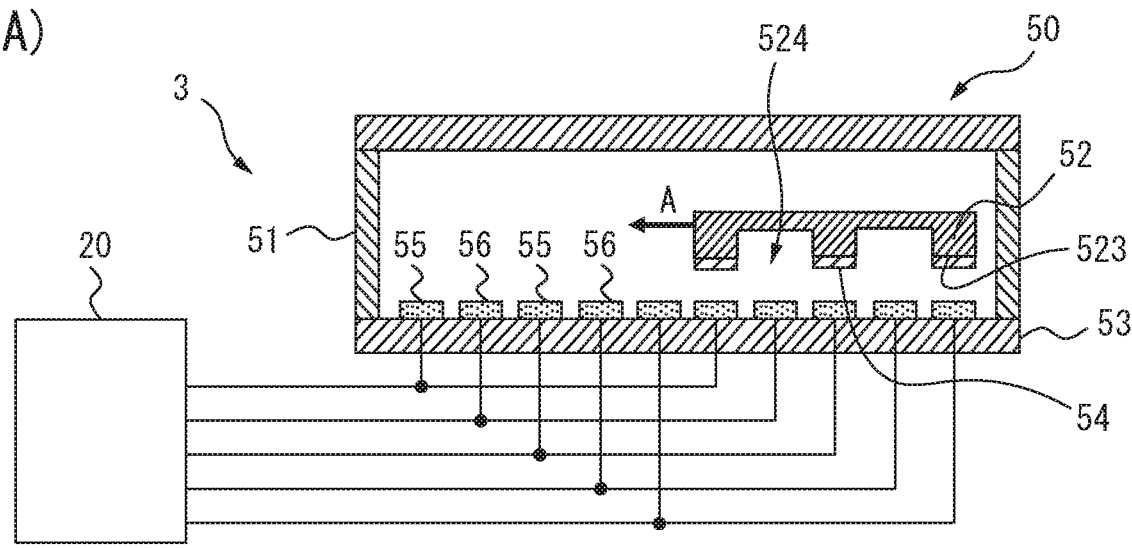
(A)
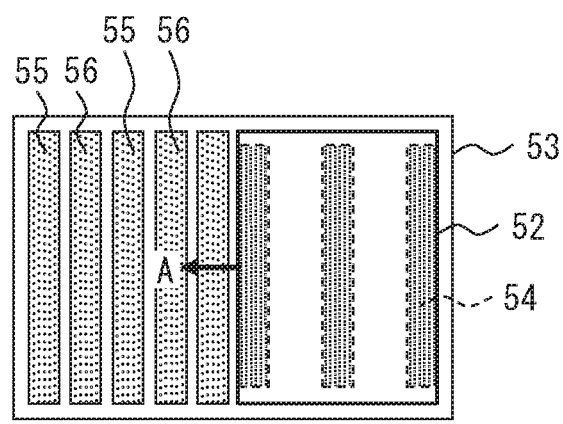
(B)
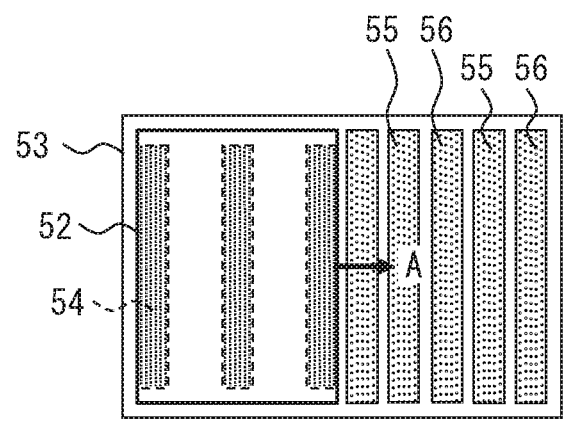
(C)

ELECTROMECHANICAL TRANSDUCER AND METHOD FOR MANUFACTURING SAME

FIELD

The present invention relates to an electromechanical transducer and a method for manufacturing the same.

BACKGROUND

Electromechanical transducers are known that use electret, which semi-permanently carries electric charge, to generate electrostatic interaction, thereby performing transduction between electric power and motive power. For example, Patent Literature 1 describes a power generator in which a disk-shaped rotor including a conductive (e.g., metallic) substrate and a disk-shaped stator including electret are disposed substantially in parallel. Patent Literature 2 describes an electrostatic motor including an annular rotor and a stator that respectively include patterned electret electrodes and other patterned electrodes thereon and face each other. Patent Literature 3 describes a rotary member of an electrostatic induction generator wherein charged films are disposed on the rotary member every predetermined angle with gaps interposed therebetween. In such an electromechanical transducer, for example, charged portions are formed on a movable member (rotor) and counter electrodes are formed on a fixed substrate (stator).

Patent Literature 4 describes an electret device including a charge outflow inhibition film that is formed so as to surround side end surfaces of an electret film and inhibits electric charge stored in the electret film from flowing out. Patent Literature 5 describes an electrostatic induction conversion device including an electret and a moisture-proof film covering the electret wherein the electret moves relative to a conductor. Patent Literature 6 describes an electret device including conductive electrodes on a substrate wherein the conductive electrodes are formed in areas where electret films are not formed and the device includes concaves between the electret films and the conductive electrodes to prevent electric charge stored in the electret films from flowing to the conductive electrodes.

CITATION LIST

Patent Literature

Patent Literature 1: Japanese Unexamined Patent Publication No. JP 2013-64921
Patent Literature 2: Japanese Unexamined Patent Publication No. JP 2016-46837
Patent Literature 3: Japanese Unexamined Patent Publication No. JP 2017-28910
Patent Literature 4: Japanese Unexamined Patent Publication No. JP 2008-277473
Patent Literature 5: Japanese Unexamined Patent Publication No. JP 2011-91996
Patent Literature 6: Japanese Unexamined Patent Publication No. JP 2014-217178

SUMMARY

If a movable member including charged portions is placed in a hot and moist environment, electric charge stored in the charged portions dissipates and thus the amount of electrostatic charge decreases. In order to increase the efficiency of transduction of an electromechanical transducer, it is desirable to form grooves in regions on the movable member other than the charged portions to reduce the weight of the movable member, and in particular, in a movable member including such grooves, electric charge easily dissipates from the side walls (side surfaces) of the grooves. Further, in particular, the use of aluminum, which has a small specific gravity, as a base material of the movable member for weight reduction results in conspicuous time-varying changes in the amount of electrostatic charge. In an electromechanical transducer using electrostatic interaction, it is thus difficult to achieve both reducing the weight of the movable member and preventing the amount of electrostatic charge from decreasing (resistance to moisture).

Accordingly, it is an object of the present invention to provide an electromechanical transducer including a light movable member that is easy to move and charged portions whose amount of electrostatic charge does not substantially change over time and a method for manufacturing such an electromechanical transducer.

Provided is an electromechanical transducer using electrostatic interaction between a charged portion and a counter electrode to perform transduction between electric power and motive power, the electromechanical transducer including a fixed substrate, a movable member being movable with a predetermined distance maintained between the fixed substrate and the movable member, the movable member having grooves in a surface facing the fixed substrate, the grooves being formed at intervals in a moving direction of the movable member, charged portions formed on the surface of the movable member so as to alternate with the grooves, counter electrodes disposed on a surface of the fixed substrate in the moving direction, the surface facing the movable member, and a cover layer containing copper and covering at least side walls of the movable member inside the grooves.

Provided is an electromechanical transducer using electrostatic interaction between a charged portion and a counter electrode to perform transduction between electric power and motive power, the electromechanical transducer including a fixed substrate, a movable member being movable with a predetermined distance maintained between the fixed substrate and the movable member, the movable member having grooves in a surface facing the fixed substrate, the grooves being formed at intervals in a moving direction of the movable member, charged portions formed on the surface of the movable member so as to alternate with the grooves, counter electrodes disposed on a surface of the fixed substrate in the moving direction, the surface facing the movable member, and a cover layer covering at least side walls of the movable member inside the grooves, the cover layer including an insulating layer at least a surface thereof.

Preferably, the cover layer contains copper and the insulating layer is copper oxide. Alternatively, the cover layer is preferably a coating of hydrated aluminum oxide.

Alternatively, the cover layer is preferably a fluorocarbon resin film. In this case, the cover layer preferably covers the side walls of the movable member and the charged portions.

Preferably, the charged portions covers the surface of the movable member between the grooves, and a base material of the movable member is not exposed between the charged portions and the cover layer.

The cover layer may cover the side walls and the surface of the movable member, and the charged portions may be formed over the cover layer in the surface of the movable member.

Preferably, the grooves penetrate the movable member in a thickness direction, and the cover layer covers the side walls of the grooves throughout the thickness of the movable member.

Preferably, the movable member is a rotary member rotatable around a rotating shaft, and the grooves, the charged portions and the counter electrodes are radially disposed around the rotating shaft.

Preferably, edges facing the grooves of the movable member are pointed portions projecting in a thickness direction of the movable member, and the cover layer covers the pointed portions of the movable member.

Provided is a method for manufacturing an electromechanical transducer using electrostatic interaction between a charged portion and a counter electrode to perform transduction between electric power and motive power, the method including the steps of forming grooves in a first substrate at intervals, forming a cover layer containing copper on at least side walls of the first substrate inside the grooves, forming charged portions on the first substrate between the grooves, and placing the first substrate so that the first substrate is movable with a predetermined distance maintained between the first substrate and a second substrate on which electrodes are disposed and that the charged portions face the electrodes.

Preferably, the grooves and the cover layer are simultaneously formed by electrically discharge machining the first substrate.

Alternatively, the cover layer may be formed by evaporating copper onto the first substrate after the grooves are formed and before the charged portions are formed.

Provided is a method for manufacturing an electromechanical transducer using electrostatic interaction between a charged portion and a counter electrode to perform transduction between electric power and motive power, the method including the steps of forming grooves in a first substrate at intervals so that charged portions are disposed on the first substrate between the grooves, forming a cover layer on at least side walls of the first substrate inside the grooves, the cover layer including an insulating layer at least a surface thereof, and placing the first substrate so that the first substrate is movable with a predetermined distance maintained between the first substrate and a second substrate on which electrodes are disposed and that the charged portions face the electrodes.

Preferably, a layer containing copper is formed as the cover layer, and the charged portions are burned to oxidize copper in the cover layer, thereby forming the insulating layer.

Alternatively, the first substrate may be made of aluminum or an aluminum alloy, and the cover layer may be formed by holding the first substrate in high-temperature water or pressurized water vapor.

Preferably, the grooves are formed by stamping the first substrate, the cover layer is formed so as to cover pointed portions of the first substrate, the pointed portions being formed at edges facing the grooves and projecting in a thickness direction of the first substrate, and the charged portions are charged after the cover layer is formed.

In the above electromechanical transducer, the movable member is light and easy to move, and the amount of electrostatic charge of the charged portions does not substantially change over time.

BRIEF DESCRIPTION OF DRAWINGS

FIGS. 2(A) and 2(B) are schematic perspective and side views of an actuator 10.

FIGS. 4(A) to 4(C) are partial cross-sectional views showing examples of the rotary member.

FIGS. 5(A) and 5(B) are partial cross-sectional views showing an actuator 10' and an example of the rotary member included therein.

FIGS. 8(A) to 8(C) are graphs showing time-varying changes in the amounts of electrostatic charge of the charged portions.

FIGS. 9(A) to 9(C) are graphs showing time-varying changes in the amounts of electrostatic charge of the charged portions.

FIGS. 10(A) to 10(C) are graphs showing time-varying changes in the amounts of electrostatic charge of the charged portions.

FIGS. 11(A) and 11(B) are graphs showing time-varying changes in the amounts of electrostatic charge of the charged portions.

FIGS. 12(A) to 12(C) are graphs showing time-varying changes in the amounts of electrostatic charge of the charged portions.

FIGS. 13(A) to 13(C) are graphs showing time-varying changes in the amounts of electrostatic charge of the charged portions.

FIGS. 17(A) to 17(C) are diagrams schematically illustrating an electromechanical transducer 3.

DESCRIPTION OF EMBODIMENTS

Hereinafter, electromechanical transducers and a method for manufacturing the same will be described with reference to the accompanying drawings. However, note that the present invention is not limited to the drawings or the embodiments described below.

Figure 1:
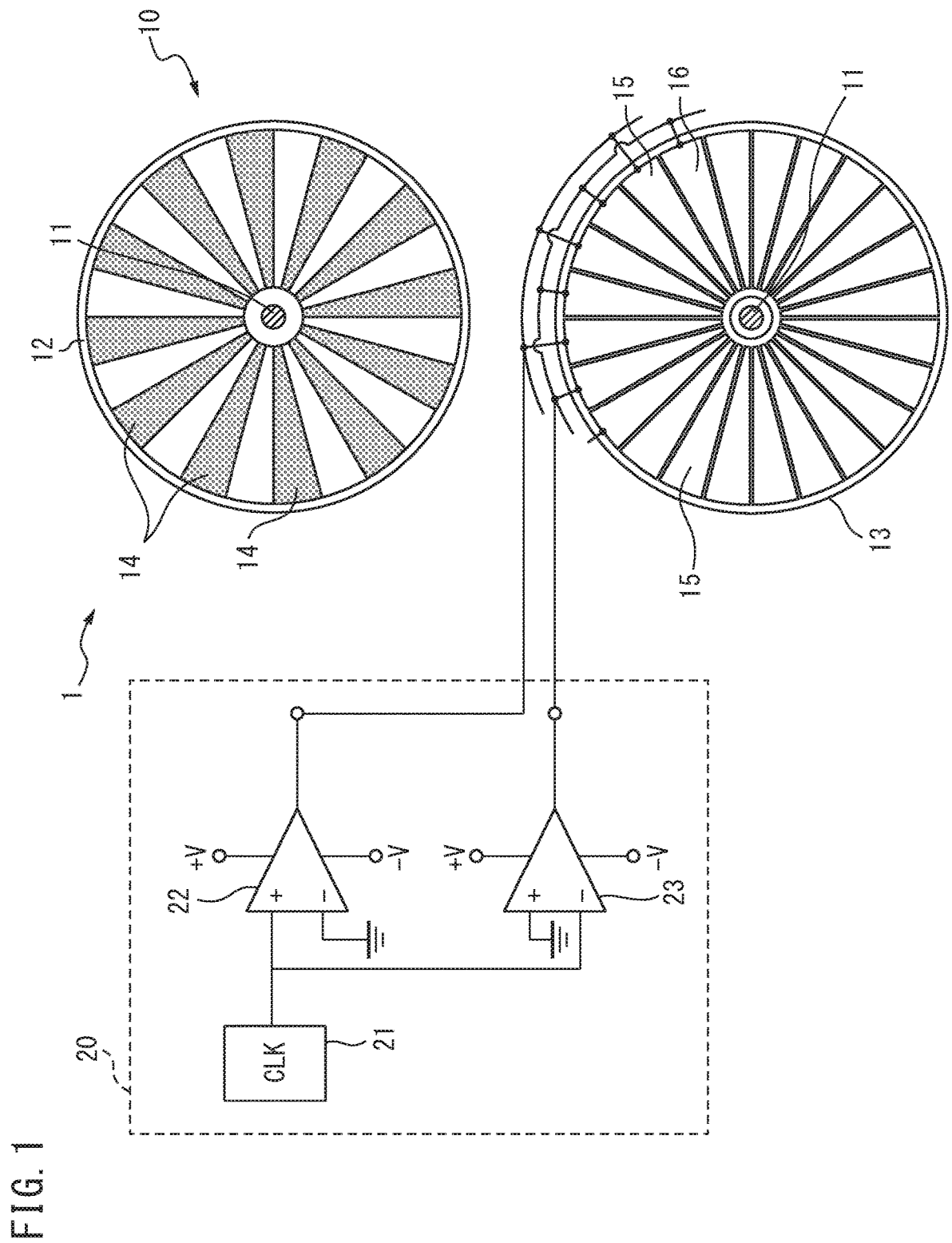
FIG. 1 is a diagram schematically illustrating an electromechanical transducer 1.

FIG. 1 is a diagram schematically illustrating an electromechanical transducer 1. As shown in FIG. 1, the electromechanical transducer 1 includes an actuator 10 and a driver 20. The actuator 10 includes a rotating shaft 11, a rotary member 12, a fixed substrate 13, charged portions 14, counter electrodes 15 and counter electrodes 16. The electromechanical transducer 1 is a driver (electret motor) that uses electrostatic force generated between the charged portions 14 and the counter electrodes 15 and 16 in response to electric signals inputted to the driving unit 20, to rotate the rotary member 12, thereby taking out motive power from electric power.

FIGS. 2(A) and 2(B) are schematic perspective and side views of the actuator 10, respectively. As shown in FIG. 2(A), the actuator 10 is constructed from the rotary member 12, which is rotatable around the rotating shaft 11, and the fixed substrate 13 disposed in parallel so that the lower surface 122 of the rotary member 12 and the upper surface 131 of the fixed substrate 13 face each other. FIG. 2(B) shows cross sections of the rotary member 12 and the fixed substrate 13 taken along the circumferences thereof, and the lateral direction of FIG. 2(B) corresponds to the direction of arrow C in FIG. 2(A). As the actuator 10, FIG. 1 shows the lower surface 122 of the rotary member 12 and the upper surface 131 of the fixed substrate 13 side by side.

The rotating shaft 11 is a center axis of rotation of the rotary member 12, and pierces the center of the rotary member 12. The upper and lower ends of the rotating shaft 11 are fixed to a housing (not shown) of the electromechanical transducer 1 with bearings.

The rotary member 12 is an example of the movable member, and is made, for example, a metal, stainless steel (SUS: special use stainless steel), glass or silicon. For weight reduction, the base material of the rotary member 12 is preferably aluminum or an aluminum alloy. For example, the diameter of the rotary member 12 is approximately 5 to 20 mm, and the thickness thereof is approximately 100 to 500 µm. For example, the rotary member 12 has a disk shape, and is connected at its center to the rotating shaft 11. The rotary member 12 can be rotated around the rotating shaft 11 in the direction of arrow C in FIG. 2(A) (i.e., clockwise and anticlockwise) by electrostatic force generated between the charged portions 14 and the counter electrodes 15 and 16 in response to electric signals inputted to the driving unit 20. In other words, the rotary member 12 is movable with a predetermined distance maintained between the fixed substrate 13 and the rotary member 12.

As shown in FIG. 2(B), for weight reduction, the rotary member 12 includes grooves 124 at regular intervals in the circumferential direction (the rotating direction and the moving direction of the rotary member 12, and the direction of arrow C). In the illustrated example, the grooves 124 penetrate the rotary member 12 in the thickness direction thereof.

The fixed substrate 13 is made of a well-known substrate material, such as a glass epoxy substrate. As shown in FIG. 2(A), for example, the fixed substrate 13 has a disk shape and is disposed below the rotary member 12 so as to face the lower surface 122 of the rotary member 12. Although its center is pierced by the rotating shaft 11, the fixed substrate 13 is fixed to the housing of the electromechanical transducer 1, unlike the rotary member 12.

The charged portions 14 are thin films made of an electret material and are formed radially around the rotating shaft 11 on the lower surface 122 of the rotary member 12, which is the surface facing the fixed substrate 13, except in a center portion near the rotating shaft 11. The charged portions 14 are substantially trapezoidal sub-regions covering the areas between the grooves 124, and are evenly spaced in the circumferential direction of the rotary member 12 and alternate with the grooves 124. The charged portions 14 carry electrostatic charge and all have the same polarity (e.g., negatively charged). Examples of the electret material of the charged portions 14 include a resin material, such as CYTOP (registered trademark), a polymeric material, such as polypropylene (PP), polyethylene terephthalate (PET) or polytetrafluoroethylene (PTFE), and an inorganic material, such as silicon oxide or silicon nitride. The thickness of the charged portions 14 is, for example, approximately 15 to 40 µm.

The counter electrodes 15 and 16 are substantially trapezoidal electrodes, and are formed on the upper surface 131 of the fixed substrate 13, which is the surface facing the rotary member 12, alternately in the circumferential direction and radially around the rotating shaft 11. Both the counter electrodes 15 and the counter electrodes 16 are formed at intervals in the circumferential direction and evenly spaced, similarly to the grooves 124 of the rotary member 12 and the charged portions 14. It is preferred that on the same circumference centered at the rotating shaft 11, the widths of the counter electrodes 15 be the same as those of the counter electrodes 16, and these widths be the same or substantially the same as those of the grooves 124 and the charged portions 14. It is also preferred that the numbers of charged portions 14, counter electrodes 15 and counter electrodes 16 be equal.

As shown in FIG. 2(B), a cover layer 19 is provided as a protective layer for preventing the amount of electrostatic charge of the charged portions 14 from decreasing due to moisture in the air, and this layer covers the side walls of the rotary member 12 inside the grooves 124, i.e., those side surfaces of the grooves 124 which are in contact with the lower surface 122 of the rotary member 12, on which the charged portions 14 are formed. The cover layer 19 covers the side walls of the grooves 124 throughout the thickness of the rotary member 12, and the charged portions 14 extend to the edges of the grooves 124 in the lower surface 122 of the rotary member 12; and therefore the base material of the rotary member 12 is not exposed between the charged portions 14 and the cover layer 19.

At least the surface of the cover layer 19 is made of an insulator, such as a metallic oxide or a resin. The cover layer 19 may be made of, for example, a resin material and may be an insulating layer throughout its thickness; or it may be made of a metallic material and have its surface oxidized, so that only its surface may be an insulating layer. In other words, the cover layer 19 may be a single layer, or may be composed of two or more layers including a topmost insulating layer and another underlying layer. As an example, the cover layer 19 is made of copper or a material containing copper, and at least its surface is copper oxide. In this case, the cover layer 19 may be copper oxide throughout its thickness, or may be composed of two layers that are a copper layer (metal layer) and a copper oxide layer (insulating layer). The thickness of the insulating layer in the cover layer 19 is preferably 0.2 µm or more because the film thickness needs to be at least 0.2 µm or more in order to cover the side walls of the grooves 124 two-dimensionally.

The driver 20 is a circuit for driving the actuator 10 and includes a clock 21 and comparators 22 and 23. As shown in FIG. 1, the output of the clock 21 is connected to inputs of the comparators 22 and 23, and the outputs of the comparators 22 and 23 are connected to the counter electrodes 15 and 16, respectively, through electric wiring. The comparators 22 and 23 each compare the electric potential of a signal inputted from the clock 21 with ground potential and output its result in the form of a binary signal, and the signals outputted from the comparators 22 and 23 are of opposite sign. When the signal inputted from the clock 21 is H, the counter electrodes 17 and 18 have electric potential of +V and −V, respectively; and when the input signal is L, the counter electrodes 17 and 18 have electric potential of −V and +V, respectively.

When driving the actuator 10, the driver 20 applies a voltage whose sign is the same as that of the electrostatic charge of the charged portions 14 to the counter electrodes 15 and a voltage whose sign is opposite to that of the electrostatic charge of the charged portions 14 to the counter electrodes 16, and alternates the signs of these voltages. Application of these voltages causes interaction between the electric fields generated by the charged portions 14 and by the counter electrodes 15 and 16, which generates attraction or repulsion between the charged portions 14 and the counter electrodes 15 and 16. The driver 20 applies an alternating voltage to the counter electrodes 15 and 16 to generate electrostatic force between the charged portions 14 and the counter electrodes 15 and 16, thereby rotating the rotary member 12.

Figure 3:
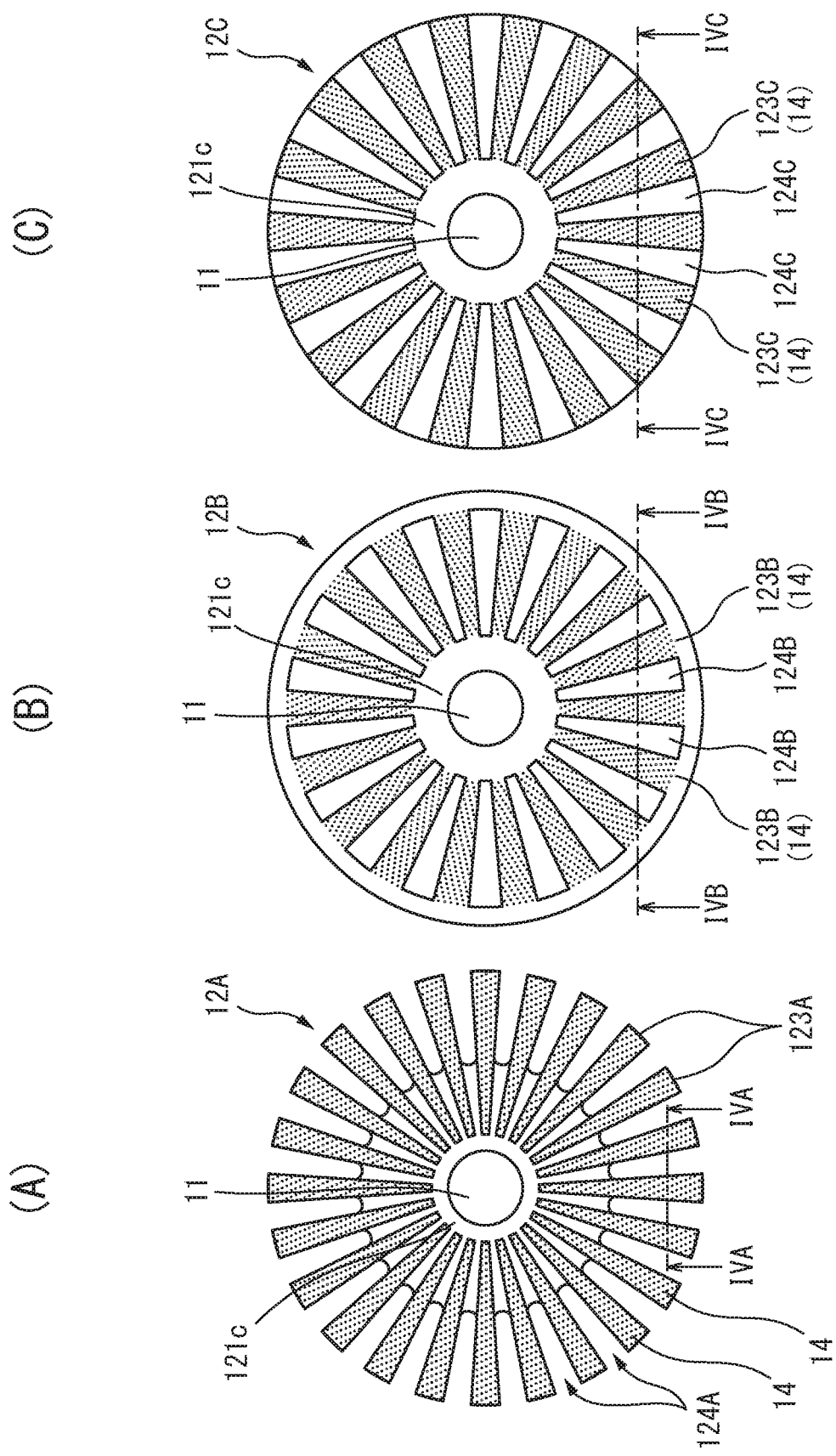
FIGS. 3(A) to 3(C) are plan views showing examples of the rotary member.

FIGS. 3(A) to 3(C) are plan views showing examples of the rotary member. FIGS. 4(A) to 4(C) are partial cross-sectional views showing examples of the rotary member. FIGS. 3(A) to 3(C) show the lower surfaces (the lower surface 122 in FIG. 2(A)) of three rotary members 12A to 12C having a flower shape, a wheel shape and a disk shape, respectively, i.e., the surfaces on which the charged portions 14 are formed. FIGS. 4(A) to 4(C) show cross sections of the rotary members 12A to 12C taken along lines IVA-IVA, IVB-IVB and IVC-IVC in FIGS. 3(A) to 3(C), respectively. The bottom and top of each of FIGS. 4(A) to 4(C) correspond to the upper surface 121 and the lower surface 122 of the corresponding rotary member, respectively.

The rotary member 12A shown in FIGS. 3(A) and 4(A) includes twenty-four substantially trapezoidal projecting portions 123A projecting radially around the rotating shaft 11 in the surface of the rotary member 12A. The projecting portions 123A have the same shape and size and are evenly spaced in the circumferential direction of the rotary member 12A. Between the projecting portions 123A, grooves 124A are formed so as to penetrate the rotary member 12A in the thickness direction thereof and these grooves correspond to the grooves 124 in FIG. 2(B). The projecting portions 123A and the grooves 124A have the same widths on the same circumference centered at the rotating shaft 11. The charged portions 14 of the rotary member 12A are twenty-four substantially trapezoidal sub-regions extending from the respective projecting portions 123A to the vicinity of the rotating shaft 11, and cover all the lower surfaces of the projecting portions 123A.

The rotary member 12B shown in FIGS. 3(B) and 4(B) includes eighteen substantially trapezoidal through-holes 124B formed radially around the rotating shaft 11. The through-holes 124B correspond to the grooves 124 in FIG. 2(B), have the same shape and size and are evenly spaced in the circumferential direction of the rotary member 12B. The through-holes 124B and flat portions (spoke portions) 123B between the through-holes 124B have the same widths on the same circumference centered at the rotating shaft 11. The charged portions 14 of the rotary member 12B are eighteen substantially trapezoidal sub-regions, and cover the flat portions 123B in the lower surface of the rotary member 12B.

The rotary member 12C shown in FIGS. 3(C) and 4(C) includes eighteen substantially trapezoidal recesses 124C formed radially around the rotating shaft 11 in the lower surface thereof. The recesses 124C correspond to the grooves 124 in FIG. 2(B) and are recessed with respect to the fixed substrate 13, but do not penetrate the rotary member 12C in the thickness direction thereof. The recesses 124C have the same shape and size and are evenly spaced in the circumferential direction of the rotary member 12C. The areas between the recesses 124C are projections 123C relatively projecting toward the fixed substrate 13, and the projections 123C and the recesses 124C have the same widths on the same circumference centered at the rotating shaft 11. The charged portions 14 of the rotary member 12C are eighteen substantially trapezoidal sub-regions, and cover the projections 123C. The upper surface of the rotary member 12C, which is the surface opposite to the fixed substrate 13, is an even surface, and the rotary member 12C has unevenness (grooves) only in the surface facing the fixed substrate 13.

In any of the rotary members 12A to 12C, the annular center portion 121c encircling the rotating shaft 11 is a flat region having neither charged portions nor grooves. The charged portions are not formed on the flat center portion 121c in the figures, but may be formed on this flat region. The numbers of projecting portions 123A, flat portions 123B and projections 123C (i.e., the number of charged portions 14) are not limited to twenty-four nor eighteen, but may be any number.

FIGS. 5(A) and 5(B) are partial cross-sectional views showing an actuator 10' and an example of the rotary member included therein. The actuator 10' includes a rotating shaft (same as the rotating shaft 11 in FIG. 2(A)), a rotary member 12', fixed substrates 13 and 13', charged portions 14 and 14' and counter electrodes 15, 16, 15' and 16'. Similarly to FIG. 2(B), FIG. 5(A) shows cross sections of the rotary member 12' and the fixed substrates 13 and 13' taken along the circumferences thereof, and the lateral direction of FIG. 5(A) corresponds to the direction of arrow C in FIG. 2(A). FIG. 5(B) shows a cross section of the rotary member 12' taken in the same manner as that in FIG. 4(A).

The fixed substrate 13, the charged portions 14 and the counter electrodes 15 and 16 of the actuator 10' are the same as those of the above actuator 10. The rotary member 12' includes the charged portions 14 on the lower surface between the grooves 124, and the charged portions 14', which are similar to the charged portions 14, on the upper surface between the grooves 124, and differs from the rotary member 12 of the actuator 10 only in that the charged portions 14' are added. The rotary member 12' may have the same shape as any of the rotary members 12A to 12C shown in FIGS. 3(A) to 3(C). The fixed substrate 13' and the counter electrodes 15' and 16' are the same as the fixed substrate 13 and the counter electrodes 15 and 16, but the fixed substrate 13' is disposed upside down with respect to the fixed substrate 13. The actuator 10' is constructed from the fixed substrate 13', the rotary member 12' and the fixed substrate 13 disposed in parallel in this order at predetermined intervals.

The counter electrodes 15' and 16' are energized with the same voltages as the counter electrodes 15 and 16. Thus, in the actuator 10', electrostatic force is generated between the charged portions 14 and the counter electrodes 15 and 16 on the lower side of the rotary member 12' and between the charged portions 14' and the counter electrodes 15' and 16' on the upper side of the rotary member 12', and therefore the obtained motive power is larger than that of the actuator 10.

As shown in FIGS. 4(A) to 4(C), the rotary members 12A to 12C include cover layers 19 on the side walls of the grooves 124A, the through-holes 124B and the recesses 124C (grooves of the rotary member), respectively. As shown in FIG. 5(B), the rotary member 12' also includes a cover layer 19 on the side walls of the grooves 124A. However, it is only necessary that these cover layers be formed at least in the grooves of the rotary member, and they may also be formed on the upper surface, the lower surface or both surfaces of the rotary member in addition to the side walls of the grooves.

Figure 6:
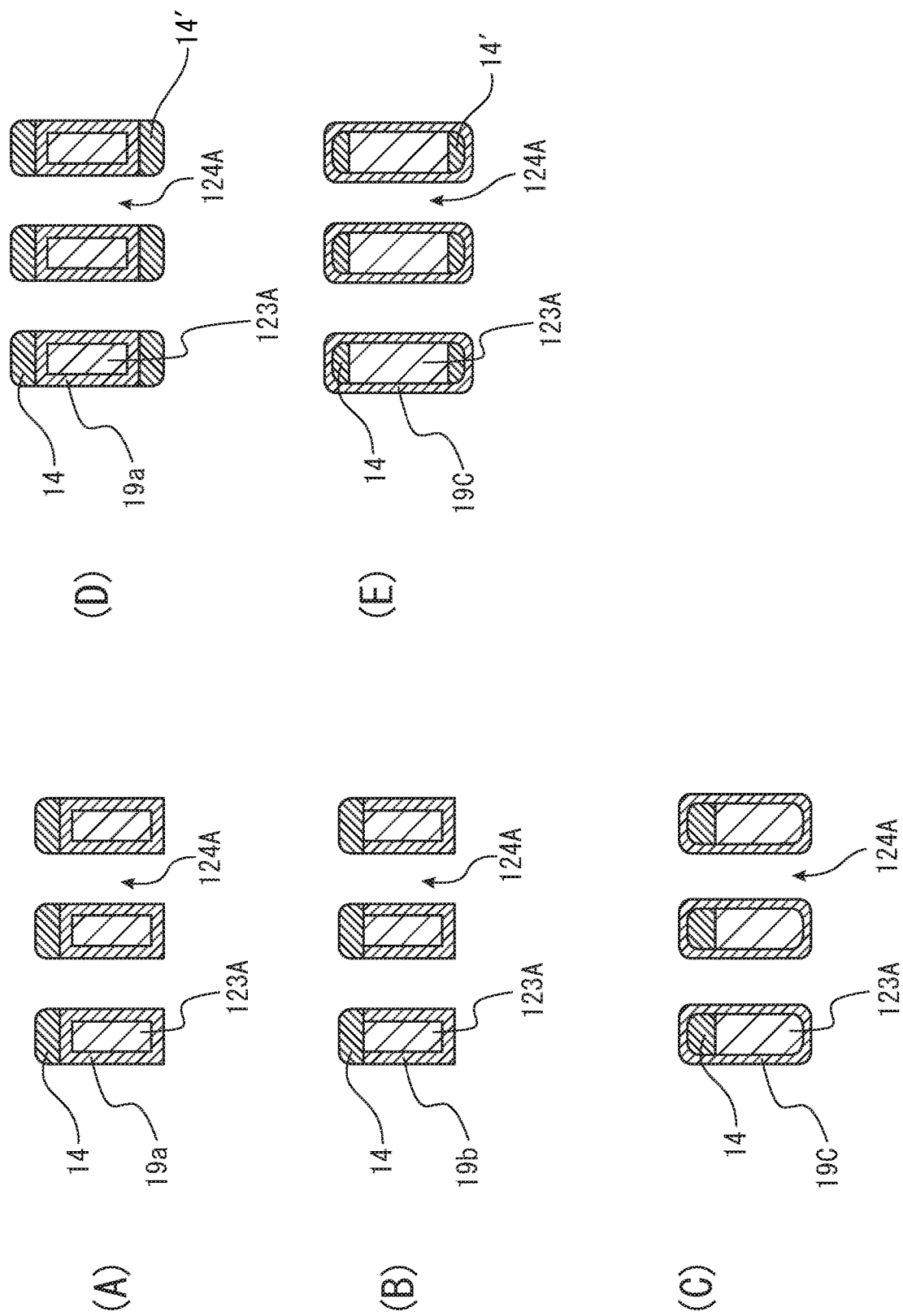
FIGS. 6(A) to 6(E) are partial cross-sectional views showing examples of disposition of the cover layer.

FIGS. 6(A) to 6(E) are partial cross-sectional views showing examples of disposition of the cover layer. The cover layer 19a shown in FIG. 6(A) is formed on all the surfaces of the rotary member including the upper and lower surfaces and the side walls of the grooves 124A. In this example, the charged portions 14 are formed over the cover layer 19a, and in the surface facing the fixed substrate 13, the cover layer 19a is covered by the charged portions 14. The cover layer 19b shown in FIG. 6(B) is formed on the side walls of the grooves 124A and the surface of the rotary member opposite to the charged portions 14, i.e., all the surfaces of the rotary member except for the surface where the charged portions 14 are formed. The cover layer 19c shown in FIG. 6(C) is formed on all the surfaces of the rotary member and covers the charged portions 14. In other words, the positional relationship between the cover layer and the charged portions 14 of FIG. 6(C) is opposite to that of FIG. 6(A), and as in this example, the cover layer may cover the charged portions, depending on the material and manufacturing method of the cover layer. The rotary member 12 may include any one of the cover layers 19a to 19c, instead of the cover layer 19.

If the charged portions 14 and 14' are formed on the respective sides of the rotary member, the cover layer may be formed on all the surfaces of the rotary member including the upper and lower surfaces and the side walls of the grooves 124A as indicated by reference numerals 19a and 19c in FIGS. 6(D) and 6(E). In this case also, the cover layer may be formed under the charged portions 14 and 14' like the cover layer 19a in FIG. 6(D), or over the charged portions 14 and 14' like the cover layer 19c in FIG. 6(E). In the examples of FIGS. 6(A) to 6(E), all the surfaces of the rotary member except for the center portion 121c may be completely covered by the charged portions 14 and the cover layer 19a or 19b, or the base material of the rotary member may be exposed only in the center portion 121c. Although FIGS. 6(A) to 6(E) show the examples in which the rotary member has the flower shape of FIG. 3(A), the wheel-shaped and disk-shaped rotary members in FIGS. 3(B) and 3(C) may also include one of the cover layers 19a to 19c.

In manufacturing the actuator 10 or 10', the rotary member 12 or 12' is first formed. Two examples of a process for manufacturing the rotary members 12 and 12' will be described below.

(Step 1-1) In the first example, grooves 124 are first formed at intervals in a substrate (first substrate) that will become a rotary member 12 or 12'. For example, if the base material of the rotary member 12 or 12' is a metal, such as aluminum, the grooves 124 are formed by stamping, laser machining or electrical discharge machining. Alternatively, if the base material of the rotary member 12 or 12' is silicon or stainless steel, the grooves 124 are formed by deep reactive-ion etching (D-RIE) or etching.

(Step 1-2) A cover layer 19 (or a cover layer 19a or 19b) is also formed on at least the side walls of the grooves 124 of the substrate. If the grooves 124 are formed by electrical discharge machining, the cover layer 19 made of a metallic material can be formed simultaneously with the grooves 124. In other words, in the case of electrical discharge machining, performing step 1-1 means that step 1-2 is also performed simultaneously. For example, the use of a copper wire in electrical discharge machining alloys the metal of the substrate that will become a rotary member 12 or 12' with copper included in the wire, and thereby an altered layer (coating of a copper alloy) containing oxygen and copper abundantly are produced in the side walls of the grooves 124, i.e., in the surfaces made by machining, and this altered layer functions as the cover layer 19.

If the grooves 124 are formed without using electrical discharge machining, the cover layer 19 may be formed by evaporating a metallic material, such as copper, onto the substrate having the grooves 124. In the case of vapor deposition, a cover layer 19a or 19b may be formed that covers the upper surface, the lower surface or both surfaces of the substrate in addition to the side walls of the grooves 124. Alternatively, if the base material of the rotary member 12 or 12' is aluminum or an aluminum alloy, the substrate having the grooves 124 may be subjected to a thermal oxidation process or a boehmite process to form, as the cover layer, an oxide film (aluminum oxide film) or a boehmite film (coating of hydrated aluminum oxide) on the surfaces (the upper and lower surfaces and the side walls of the grooves 124) thereof. The boehmite film is formed by holding the substrate having the grooves 124 in high-temperature water or pressurized water vapor of 90 to 100° C. or more.

(Step 1-3) Then, regions that will become charged portions 14 are formed from an electret material between the grooves 124 on a flat surface (single side) of the substrate having the grooves 124 and the cover layer, and in the case of the rotary member 12', regions that will become charged portions 14' are also formed from an electret material on the opposite surface. For example, a resin material, such as CYTOP (registered trademark), or an inorganic material, such as silicon dioxide or silicon nitride, is used as the electret material of the charged portions 14 and 14'.

(Step 1-4) Next, the substrate thus obtained is burned, for example, at a high temperature of 280° C. If a metallic material is evaporated to form the cover layer in step 1-2, this burning oxidizes the cover layer to form an insulating layer on the surface thereof.

(Step 1-5) Thereafter, the regions that will become charged portions 14 and 14' are charged, for example, by corona discharge. At this time, a needle-shaped electrode or a wire electrode is disposed so as to face the electret material on the substrate, and a high voltage (e.g., several thousand volts) is applied to this electrode. In this way, electrons are discharged from the needle-shaped electrode toward the substrate to form the charged portions 14 and 14' carrying negative charge. The rotary member 12 or 12' is thus completed.

(Step 2-1) In the second example, a substrate (first substrate) of aluminum or an aluminum alloy is prepared as the base material of the rotary member 12 or 12', and first a sheet-like electret material made of, for example, PTFE in advance is affixed to a single side or both sides of the substrate.

(Step 2-2) Then, the substrate having a sheet of the electret material is subjected to stamping to form grooves 124. In this way, the electret sheet is divided into sub-regions on the single side or both sides of the substrate, and thereby regions that will become charged portions 14 and 14' are disposed on the substrate between the grooves 124.

(Step 2-3) Further, a resin film, such as a fluorocarbon resin film, or a boehmite film is formed as a cover layer on the substrate having the grooves 124. In the case of a resin film, the cover layer is formed on all the surfaces of the substrate to cover the regions that will become charged portions 14 and 14' as shown in FIGS. 6(C) and 6(E). In the case of a boehmite film, it is formed only on the regions where aluminum of the substrate is exposed, and therefore in the rotary member 12', the cover layer is formed only on the side walls of the grooves 124 as shown in FIG. 5(B), while in the rotary member 12', it is also formed on the surface opposite to the charged portions 14 as shown in FIG. 6(B).

(Step 2-4) Further, if the cover layer is a resin film, it is dried at room temperature. If the cover layer is a boehmite film, this drying is omitted.

(Step 2-5) Thereafter, the regions that will become charged portions 14 and 14' are charged, for example, by corona discharge. At this time, a needle-shaped electrode or a wire electrode is disposed so as to face the electret material on the substrate, and a high voltage (e.g., several thousand volts) is applied to this electrode. In this way, electrons are discharged from the needle-shaped electrode toward the substrate to form the charged portions 14 and 14' carrying negative charge. The rotary member 12 or 12' is thus completed.

Thereafter, the rotary member 12 or 12' is attached to a rotating shaft 11, and in the case of the actuator 10, the rotary member 12 and the fixed substrate 13 are disposed in parallel at a predetermined interval so that the counter electrodes 15 and 16 of the fixed substrate 13 and the charged portions 14 of the rotary member 12 face each other. In the case of the actuator 10' also, three components of the rotary member 12' and the fixed substrates 13 and 13' are similarly disposed in parallel. In this way, the actuator 10 or 10' is completed. The above charging step using corona discharge may be performed after the attachment to the rotating shaft 11.

In electrical discharge machining, the cover layer 19 is formed only on the side walls of the grooves 124, but can be formed simultaneously with substrate machining for forming the grooves 124. Accordingly, the use of electrical discharge machining is preferable because an additional manufacturing step is not required for forming the cover layer 19. In the case of vapor deposition, the film thicknesses of the cover layers 19, 19a and 19b are at most approximately 1 μm, but in the case of electrical discharge machining, a cover layer 19 having a thickness of several tens of micrometers can be easily formed. Thus, the use of electrical discharge machining is also preferable in order to ensure that the cover layer 19 has a sufficient thickness.

Figure 7:
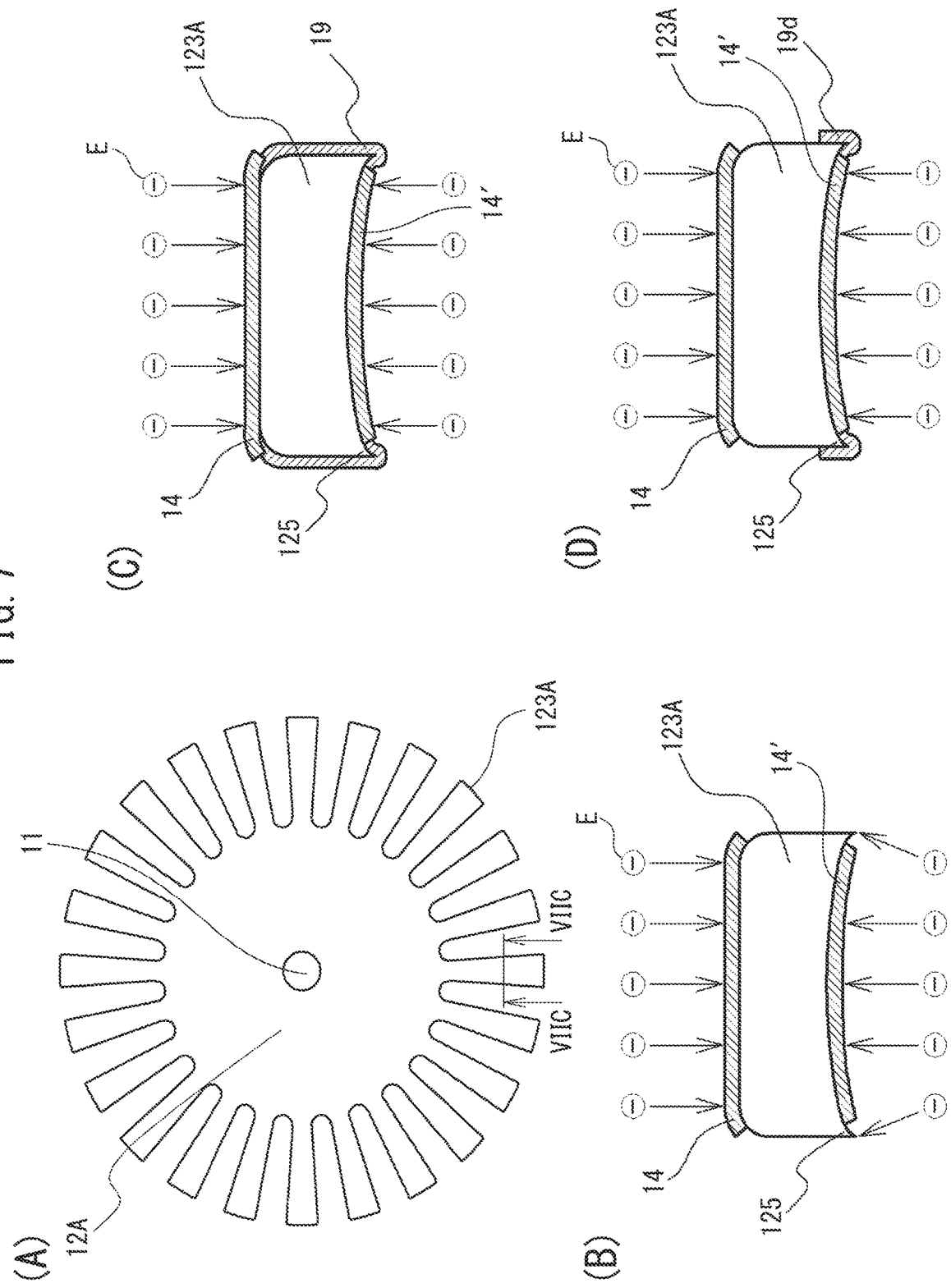
FIGS. 7(A) to 7(D) are diagrams for explaining disposition of the cover layer and how it works at the time of charging.

FIGS. 7(A) to 7(D) are diagrams for explaining disposition of the cover layer and how it works at the time of charging. FIG. 7(A) is a plan view of the flower-shaped rotary member 12A shown in the FIG. 3(A), and FIGS. 7(B) to 7(D) show cross sections of one of the projecting portions 123A of the rotary member 12A. FIGS. 7(B), 7(C) and 7(D) are cross-sectional views of the case in which the cover layer 19 is not provided, the case in which the cover layer 19 is formed on the side surfaces of the projecting portions 123A, and the case in which only each of pointed bottom corners (pointed portions) 125 of the projecting portions 123A is provided with a cover layer 19d, respectively. These figures show the cases in which the charged portions 14 and 14' are formed on the respective sides of the rotary member 12A, but in FIG. 7(A), illustration of the charged portions 14 and 14' and the cover layer 19 is omitted. FIG. 7(C) corresponds to the cross-sectional view of the rotary member 12A taken along line VIIC-VIIC in FIG. 7(A).

If the base material of the rotary member 12 or 12' is a metal, stamping is more productive than electrical discharge machining and laser machining because all the grooves 124 can be formed at once. However, stamping causes each corner on one side of the substrate to have a pointed shape as indicated by reference numeral 125 in FIGS. 7(B) to 7(D). More specifically, corners formed at the edges facing the grooves 124 of the substrate that will become a rotary member 12 or 12' are pointed portions (burrs) projecting in the thickness direction (downward in the figures). If resin films that will become charged portions 14 and 14' are formed on this substrate and a high voltage is applied thereto (above-described step 1-3), the pointed portions 125 function as antennas and attract electric charges (electrons E) as shown in FIG. 7(B), and therefore the electric charges do not easily accumulate in the electret material. This reduces the surface potential of the charged portions 14' on the surface where the pointed portions 125 are formed, and thus decreases the amount of electrostatic charge.

Accordingly, if the rotary member 12 or 12' is formed by stamping, it is preferred that the cover layer 19 cover the pointed portions 125 made by stamping, as shown in FIG. 7(C). The required thickness of the cover layer 19 is at most 1 μm because it is sufficient for the pointed portions 125 to be electrically insulated. Although FIGS. 7(A) to 7(D) show the examples in which the rotary member has the flower shape of FIG. 3(A), the same holds true for the wheel-shaped and disk-shaped rotary members in FIGS. 3(B) and 3(C).

The process in which the pointed portions 125 are covered with an electrically insulating cover layer 19 and then the charged portions 14 and 14' are formed by being charged prevents electric charges from being attracted to the pointed portions 125 during corona discharge, and thus electric charges are efficiently injected into the electret material. Since this increases the efficiency of charging and thus increases the amount of electrostatic charge stored in the electret material as compared to the case in which the cover layer 19 is not provided, the surface potential of the charged portions 14' on the surface where the pointed portions 125 are formed can be raised. Accordingly, when the manufactured rotary member is used for an electret motor, larger torque can be generated. In order to prevent the amount of electrostatic charge from decreasing at the time of charging, it is sufficient to cover only the pointed portions 125 with an insulating film as indicated by reference numeral 19d in FIG. 7(D), but in order to prevent the amount of electrostatic charge from changing over time after the charging, it is necessary to completely cover the side surfaces of the grooves of the rotary member with the cover layer as shown in FIG. 7(C).

FIGS. 8(A) to 15(B) are graphs showing time-varying changes in the amounts of electrostatic charge of the charged portions. The abscissa of each graph represents time t in hours (h). The ordinate of each graph represents the surface potential V of the charged portions 14 and 14' in volts (V). Each graph shows results of measurement for two or three rotary members 12' having charged portions on both sides thereof and regression lines of these results in a superposed manner. Since the amount of electrostatic charge of the charged portions 14 and 14' decreases as time goes by (changes over time), the slopes of the regression lines $\Delta V / \Delta \ln(t)$ are negative values (ln is a natural logarithm). The graphs indicate that the gentler these slopes, i.e., the smaller the absolute values of the slopes, the less the amounts of electrostatic charge decrease.

FIGS. 8(A) to 10(C) show time-varying changes in the amounts of electrostatic charge of the rotary members 12' placed in the environment of temperature 30° C. and humidity 60%, wherein the base material of the rotary members is aluminum and their charged portions 14 and 14' are 15 μm in thickness and made of CYTOP (registered trademark), which is a fluorocarbon resin material. The rotary members 12' of FIGS. 8(A) to 10(B) have the flower shape of FIG. 3(A), and those of FIG. 10(C) have the wheel shape of FIG. 3(B).

FIG. 8(A) shows the results of the case in which the diameter is 12 mm, the numbers of charged portions 14 and 14' are twenty-four each, the grooves 124A are formed by stamping, and the cover layer 19 is not provided. FIG. 8(B) shows the results of the case in which the diameter is 11.5 mm, the numbers of charged portions 14 and 14' are thirty each, the grooves 124A are formed by laser machining, and the cover layer 19 is not provided. FIG. 8(C) shows the results of the case in which the diameter is 12 mm, the numbers of charged portions 14 and 14' are twenty-four 0.4-μm thick cover layer 19c of a fluorocarbon resin film is formed on all the surfaces. The results of FIGS. 8(A) to 10(C) are summarized in Table 1.

TABLE 1

| FIG. | base material | charged portions | processing | cover layer | filmed surfaces | film thickness | regression line | slope |
|------|---------------|------------------|------------|-------------|-----------------|----------------|-----------------|-------|
| 8(A) | aluminum | CYTOP (film thickness 15 μm) | stamping | none | — | — | 8a | −6.63 |
|      |          |                              |          |      |   |   | 8b | −5.99 |
|      |          |                              |          |      |   |   | 8c | −7.62 |
| 8(B) |          |                              | laser    | none | — | — | 8d | −6.43 |
|      |          |                              |          |      |   |   | 8e | −10.5 |
|      |          |                              |          |      |   |   | 8f | −6.92 |
| 8(C) |          |                              | stamping | oxide film | all | <0.1 μm | 8g | −9.17 |
|      |          |                              |          |            |     |         | 8h | −9.03 |
|      |          |                              |          |            |     |         | 8i | −9.75 |
| 9(A) |          |                              | stamping | Cu vapor deposition | all | 0.3 μm | 9a | −4.07 |
|      |          |                              |          |                     |     |        | 9b | −3.60 |
|      |          |                              |          |                     |     |        | 9c | −4.75 |
| 9(B) |          |                              | stamping | Cu vapor deposition | side & bottom | 0.3 μm | 9d | −6.45 |
|      |          |                              |          |                     |               |        | 9e | −2.81 |
| 9(C) |          |                              | stamping | boehmite film | all | 1-2 μm | 9g | −3.85 |
|      |          |                              |          |               |     |        | 9h | −3.07 |
|      |          |                              |          |               |     |        | 9i | −1.96 |
| 10(A) |         |                              | electrical discharge | Cu containing layer | side | several micrometers | 10a | −0.60 |
|       |         |                              |                      |                     |      |                     | 10b | −2.02 |
|       |         |                              |                      |                     |      |                     | 10c | −2.84 |
| 10(B) |         |                              | electrical discharge | Cu containing layer | side | several micrometers | 10d | −2.18 |
|       |         |                              |                      |                     |      |                     | 10e | −2.03 |
|       |         |                              |                      |                     |      |                     | 10f | −2.44 |
| 10(C) |         |                              | stamping | fluorocarbon resin film | all | 0.4 μm | 10g | −3.74 |
|       |         |                              |          |                         |     |        | 10h | −4.73 |
|       |         |                              |          |                         |     |        | 10i | −4.09 | each, the grooves 124A are formed by stamping, and a cover layer 19a of an oxide film (aluminum oxide film) having a thickness of 0.1 μm or less is formed on all the surfaces. In the case of FIG. 8(C), since the cover layer 19a is thin, there are regions left uncovered with the cover layer.

FIGS. 9(A) to 9(C) show the results of the cases in which the diameter is 12 mm, the numbers of charged portions 14 and 14' are twenty-four each, and the grooves 124A are formed by stamping. FIG. 9(A) shows the results of the case in which a 0.3-μm thick copper cover layer 19a is formed by vapor deposition on all the surfaces (the upper and lower surfaces and the side surfaces of the grooves). FIG. 9(B) shows the results of the case in which a 0.3-μm thick copper cover layer 19b is formed by vapor deposition on the bottom surface (the surface opposite to the charged portions 14) and the side surfaces of the grooves. In the cases of FIGS. 9(A) and 9(B), the surfaces of the cover layers 19a and 19b have become copper oxide by burning. FIG. 9(C) shows the results of the case in which a cover layer 19a of a boehmite film having a thickness of 1 to 2 μm is formed on all the surfaces.

FIG. 10(A) shows the results of the case in which the diameter is 12 mm, the numbers of charged portions 14 and 14' are twenty-four each, and the grooves 124A and the cover layer 19 containing copper (and covering only the side surfaces) are formed by electrical discharge machining. FIG. 10(B) shows the results of the case in which the diameter is 11.5 mm, the numbers of charged portions 14 and 14' are thirty each, the grooves 124A and the cover layer 19 containing copper (and covering only the side surfaces) are formed by electrical discharge machining. FIG. 10(C) shows the results of the case in which the diameter is 12 mm, the numbers of charged portions 14 and 14' are twenty-four each, the through-holes 124B are formed by stamping, a In the cases of FIGS. 8(A) and 8(B) in which the cover layer 19 is not provided and in the case of FIG. 8(C) in which the thickness of the cover layer 19a is 0.1 μm or less, the surface potential, which is approximately 160 V immediately after the charging (at time 0), decreases to 100 V or less approximately 1000 hours later. However, the slopes of the regression lines are gentler in FIGS. 9(A) to 10(C) than in FIGS. 8(A) to 8(C), which shows that the cover layers 19, 19a to 19c having a thickness of 0.3 μm or more on the side surfaces of the grooves or all the surfaces prevent the amount of electrostatic charge from substantially changing over time.

FIGS. 11(A) and 11(B) show time-varying changes in the amounts of electrostatic charge of the wheel-shaped rotary members 12B of FIG. 3(B) placed in the environment of temperature 30° C. and humidity 90%, wherein the base material of the rotary members is silicon and their charged portions 14 and 14' are 15 μm in thickness and made of CYTOP (registered trademark). These figures show the results of the cases in which the diameter is 8.9 mm, the numbers of charged portions 14 and 14' are thirty each, and the through-holes 124B are formed by deep reactive-ion etching (D-RIE). FIGS. 11(A) and 11(B) show the results of the case in which the cover layer 19 is not provided and the case in which a 0.3-μm thick copper cover layer 19a is formed on all the surfaces by vapor deposition, respectively. In the case of FIG. 11(B), the surfaces of the cover layer 19a have become copper oxide by burning. The results of FIGS. 11(A) and 11(B) are summarized in Table 2. The slopes of the regression lines are gentler in FIG. 11(B) than in FIG. 11(A), which shows that the 0.3-μm thick cover layer 19a prevents the amount of electrostatic charge from substantially changing over time.

TABLE 2

| FIG. | base material | charged portions | processing | cover layer | filmed surfaces | film thickness | regression line | slope |
|---|---|---|---|---|---|---|---|---|
| 11(A) | silicon | CYTOP (film thickness 15 μm) | D-RIE | none | — | — | 11a | −5.57 |
|  |  |  |  |  |  |  | 11b | −3.81 |
|  |  |  |  |  |  |  | 11c | −3.79 |
| 11(B) |  |  |  | Cu vapor deposition | all | 0.3 μm | 11d | −1.66 |
|  |  |  |  |  |  |  | 11e | −3.59 |
|  |  |  |  |  |  |  | 11f | −1.75 |

FIGS. 12(A) to 12(C) show time-varying changes in the amounts of electrostatic charge of the wheel-shaped rotary members 12B of FIG. 3(B) placed in the environment of temperature 30° C. and humidity 90%, wherein the base material of the rotary members is stainless steel and their charged portions 14 and 14' are 15 μm in thickness and made of CYTOP (registered trademark). These figures show the results of the cases in which the diameter is 8.9 mm, the numbers of charged portions 14 and 14' are thirty each, and the through-holes 124B are formed by etching. FIGS. 12(A), 12(B) and 12(C) show the results of the case in which the cover layer 19 is not provided, the case in which a 0.3-μm thick copper cover layer 19a is formed on all the surfaces by vapor deposition, and the case in which a cover layer 19a of an oxide film having a thickness of 0.1 μm or less is formed (by anodic oxidation) on all the surfaces, respectively. In the case of FIG. 12(B), the surfaces of the cover layer 19a have become copper oxide by burning. In the case of FIG. 12(C), since the cover layer 19a is thin, there are regions left uncovered with the cover layer. These results are summarized in Table 3.

TABLE 3

| FIG. | base material | charged portions | processing | cover layer | filmed surfaces | film thickness | regression line | slope |
|---|---|---|---|---|---|---|---|---|
| 12(A) | SUS | CYTOP (film thickness 15 μm) | etching | none | — | — | 12a | −4.89 |
|  |  |  |  |  |  |  | 12b | −5.12 |
|  |  |  |  |  |  |  | 12c | −5.44 |
| 12(B) |  |  |  | Cu vapor deposition | all | 0.3 μm | 12d | −1.97 |
|  |  |  |  |  |  |  | 12e | −1.96 |
|  |  |  |  |  |  |  | 12f | −2.36 |
| 12(C) |  |  |  | oxide film | all | <0.1 μm | 12g | −4.99 |
|  |  |  |  |  |  |  | 12h | −4.42 |
|  |  |  |  |  |  |  | 12i | −5.78 |

In the case of FIG. 12(C), the time-varying changes in the amounts of electrostatic charge are substantially the same as those in the case of FIG. 12(A); but the slopes of the regression lines are gentler in FIG. 12(B) than in FIG. 12(A), which shows that the 0.3-μm thick cover layer 19a prevents the amount of electrostatic charge from substantially changing over time.

Figure 14:
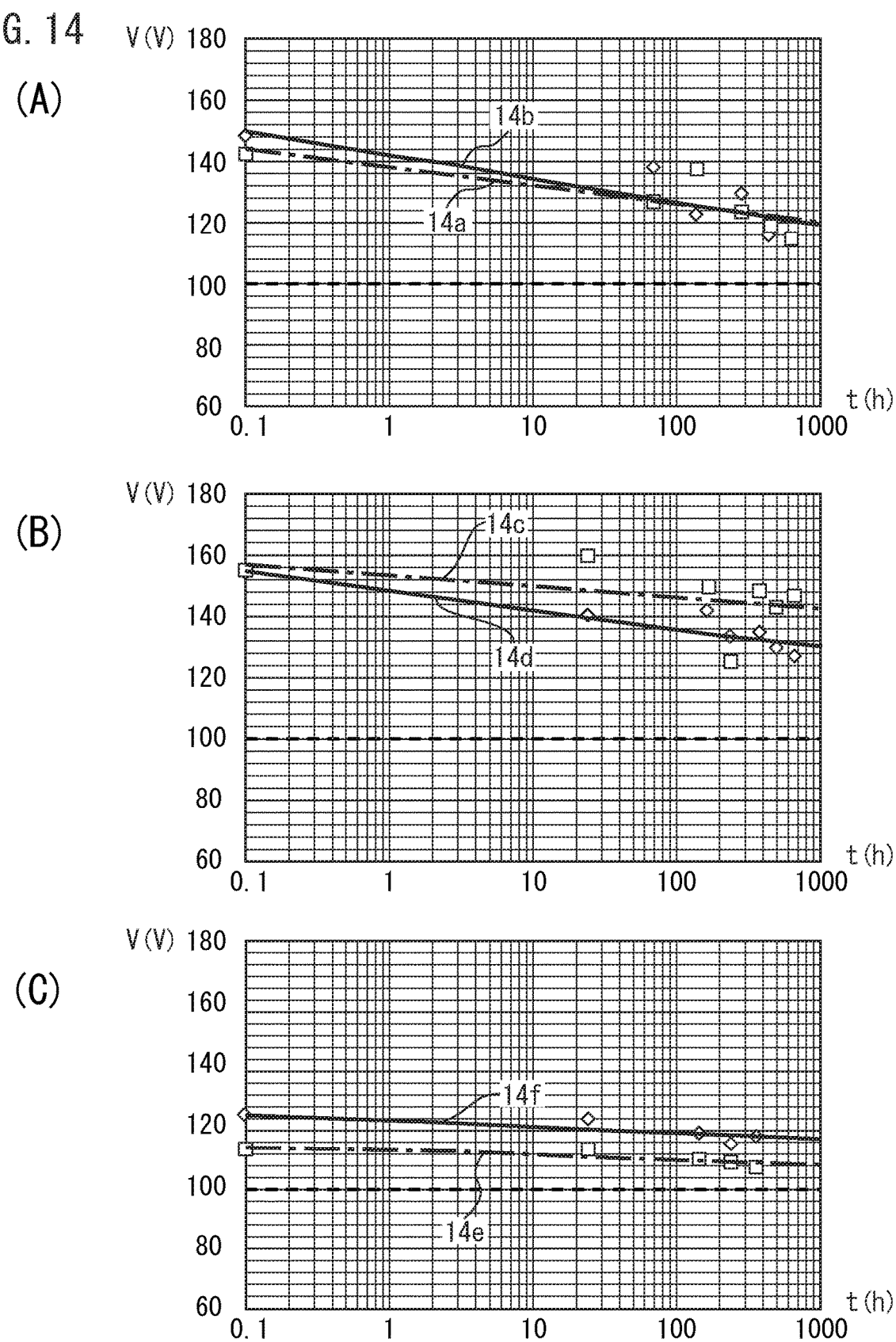
FIGS. 14(A) to 14(C) are graphs showing time-varying changes in the amounts of electrostatic charge of the charged portions.

FIGS. 13(A) to 14(C) show time-varying changes in the amounts of electrostatic charge of the rotary members 12' placed in the environment of temperature 30° C. and humidity 60%, wherein the base material of the rotary members is aluminum and their charged portions 14 and 14' are 25 μm in thickness and made of PTFE. The rotary members 12' of FIGS. 13(A) and 13(B) have the flower shape, and those of FIGS. 13(C) to 14(C) have the wheel shape. These figures show the results of the cases in which the diameter is 12 mm, the numbers of charged portions 14 and 14' are twenty-four each, and the grooves 124A or the through-holes 124B are formed by stamping. FIGS. 13(A) and 13(C) show the results of the case in which the cover layer 19 is not provided, and FIG. 13(B) shows the results of the case in which a 0.5-μm thick cover layer 19c of a fluorocarbon resin film is formed on all the surfaces. FIGS. 14(A) and 14(B) show the results of the cases in which 0.2-μm and 0.4-μm thick cover layers 19c of fluorocarbon resin films are formed, and FIG. 14(C) shows the results of the case in which a cover layer 19 of a boehmite film having a thickness of 1 to 2 μm is formed only on the side surfaces.

Figure 15:
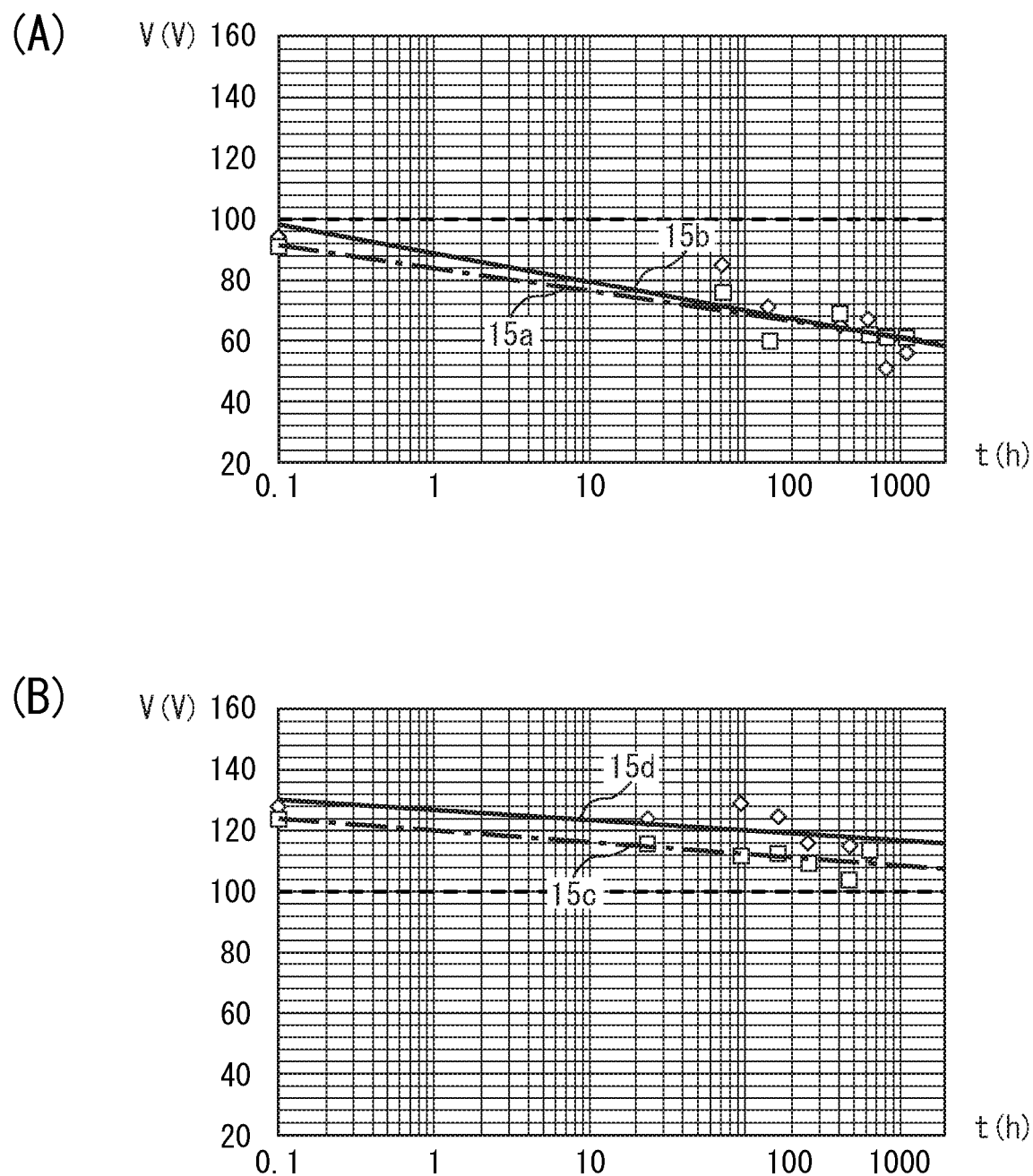
FIGS. 15(A) and 15(B) are graphs showing time-varying changes in the amounts of electrostatic charge of the charged portions.

FIGS. 15(A) and 15(B) show time-varying changes in the amounts of electrostatic charge of the wheel-shaped rotary members 12B placed in the environment of temperature 30° C. and humidity 60%, wherein the base material of the rotary members is aluminum and their charged portions 14 and 14' are 38 μm in thickness and made of PTFE. These figures show the results of the cases in which the diameter is 12 mm, the numbers of charged portions 14 and 14' are twenty-four each, and the through-holes 124B are formed by stamping. FIGS. 15(A) and 15(B) show the results of the case in which the cover layer 19 is not provided and the case in which a 0.2-μm thick cover layer 19c of a fluorocarbon resin film is formed on all the surfaces, respectively. The results of FIGS. 13(A) to 15(B) are summarized in Table 4.

TABLE 4

| FIG. | base material | charged portions | processing | cover layer | filmed surfaces | film thickness | regression line | slope |
|---|---|---|---|---|---|---|---|---|
| 13(A) | aluminum | PTFE (film | stamping | none | — | — | 13a | −3.76 |
|  |  |  |  |  |  |  | 13b | −3.47 |

TABLE 4-continued

| FIG. | base material | charged portions | processing | cover layer | filmed surfaces | film thickness | regression line | slope |
|---|---|---|---|---|---|---|---|---|
| 13(B) | | thickness 25 μm) | | fluorocarbon resin film | all | 0.5 μm | 13c | −0.99 |
| | | | | | | | 13d | −2.48 |
| 13(C) | | | | none | — | — | 13e | −5.14 |
| | | | | | | | 13f | −2.87 |
| 14(A) | | | | fluorocarbon resin film | all | 0.2 μm | 14a | −2.65 |
| | | | | | | | 14b | −3.36 |
| 14(B) | | | | fluorocarbon resin film | all | 0.4 μm | 14c | −1.65 |
| | | | | | | | 14d | −2.64 |
| 14(C) | | | | boehmite film | side | 1-2 μm | 14e | −0.60 |
| | | | | | | | 14f | −6.94 |
| 15(A) | | PTFE (film thickness 38 μm) | | none | — | — | 15a | −3.25 |
| | | | | | | | 15b | −4.05 |
| 15(B) | | | | fluorocarbon resin film | all | 0.2 μm | 15c | −1.71 |
| | | | | | | | 15d | −1.47 |

The slopes of the regression lines are gentler in FIGS. 13(B) and 15(B) than in FIGS. 13(A) and 15(A), respectively, and the slopes are gentler in FIGS. 14(A) to 14(C) than in FIG. 13(C). This shows that the cover layers 19 and 19c having a thickness of 0.2 μm or more prevent the amount of electrostatic charge from substantially changing over time. The slopes of the regression lines are far gentler in FIG. 14(B) than in FIG. 14(A), which shows that the thicker the fluorocarbon resin film, the greater the effect of preventing time-varying changes in the amounts of electrostatic charge.

As described above, one of the cover layers 19, 19a to 19c having a thickness of 0.2 μm or more is formed on those side walls (side surfaces) of the grooves 124 of the rotary members 12 and 12' which are in contact with the surfaces where the charged portions 14 and 14' are formed so that the side walls may be completely covered, and this layer prevents the amount of electrostatic charge of the charged portions 14 and 14' from substantially decreasing even in highly humid environments. Although not shown in FIGS. 8(A) to 15(B), the disk-shaped rotary member 12C of FIG. 3(C) provided with any one of the cover layers 19, 19a to 19c also has the same effect. Further, the use of aluminum or an aluminum alloy having a small specific gravity as the base material of the rotary member 12 or 12' and provision of the grooves 124 lead to weight reduction and thus reduce the moment of inertia. For this reason, the electromechanical transducer 1 can be stably driven even with small torque and keep generating large torque even in highly humid environments, and is therefore a highly reliable electret motor in which both weight reduction and resistance to moisture are achieved.

Figure 16:
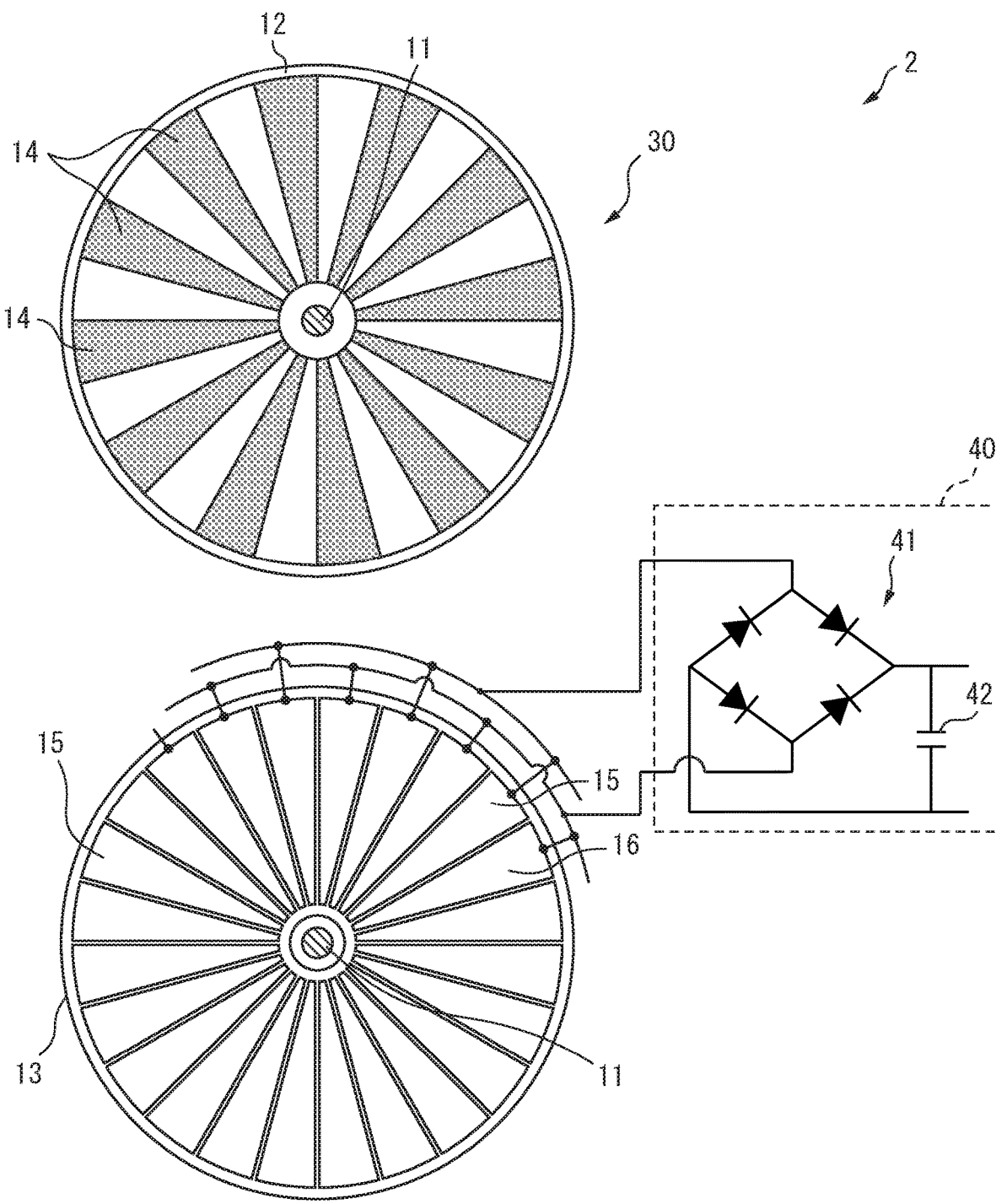
FIG. 16 is a diagram schematically illustrating an electromechanical transducer 2.

FIG. 16 is a diagram schematically illustrating an electromechanical transducer 2. As shown in FIG. 16, the electromechanical transducer 2 includes a power-generating unit 30 and a charging unit 40. The power-generating unit 30 includes a rotating shaft 11, a rotary member 12, a fixed substrate 13, charged portions 14 and counter electrodes 15 and 16, similarly to the actuator 10. The electromechanical transducer 2 is an electric generator (electret power generator) that rotates the rotary member 12 with kinetic energy of the external environment and causes electrostatic induction in the power-generating unit 30 to generate static electricity, thereby taking out electric power from motive power.

The rotating shaft 11, the rotary member 12, the fixed substrate 13, the charged portions 14 and the counter electrodes 15 and 16 are the same as those of the actuator 10, but in the power-generating unit 30, a rotary weight (not shown) having an uneven weight balance is attached to the rotary member 12 or to another component that is separate from the rotary member 12. As its power source, the power-generating unit 30 uses, for example, motions of a human carrying the electromechanical transducer 2 or vibrations of a machine provided with the electromechanical transducer 2, to rotate the rotary weight, thereby rotating the rotary member 12 in the circumferential direction thereof. The rotation of the rotary member 12 increases and decreases the overlapping area between the charged portions 14 and the counter electrodes 15 and 16. For example, if the charged portions 14 are negatively charged, the rotation of the rotary member 12 increases and decreases positive charges attracted to the counter electrodes 15 and 16, thereby generating an alternating current between the counter electrodes 15 and 16. In this way, the power-generating unit 30 generates a current to generate electric power using electrostatic induction.

The charging unit 40 includes a rectifier circuit 41 and a storage battery 42, and stores electric power generated by electrostatic induction between the charged portions 14 and the counter electrodes 15 and 16 in response to the rotation of the rotary member 12. The counter electrodes 15 and 16 of the electromechanical transducer 2 are connected to the rectifier circuit 41 through electric wiring, and the rectifier circuit 41 is connected to the storage battery 42. The rectifier circuit 41 is a bridge circuit including four diodes and rectifies the current generated between the counter electrodes 15 and 16. The storage battery 42 is a chargeable and dischargeable battery, such as a lithium-ion battery, stores the electric power generated by the power-generating unit 30 and supplies the electric power to a circuit (not shown) to be driven.

The rotary member 12 of the power-generating unit 30 also includes the above cover layer 19 (or one of the cover layers 19a to 19c). Accordingly, the amount of electrostatic charge of the charged portions 14 in the rotary member 12 of the power-generating unit 30 does not substantially decrease, and this results in a highly reliable electret power generator in which both weight reduction and resistance to moisture are achieved.

FIGS. 17(A) to 17(C) are diagrams schematically illustrating an electromechanical transducer 3. As shown in FIG. 17(A), the electromechanical transducer 3 includes an actuator 50 and a driver 20. The actuator 50 includes a housing 51, a sliding board 52, a fixed substrate 53, charged portions 54 and counter electrodes 55 and counter electrodes 56. FIGS. 17(B) and 17(C) are plan views showing the arrangement of the charged portions 54 and the counter electrodes 55 and 56, and the moving direction of the sliding board 52. The electromechanical transducer 3 is an electret motor that uses electrostatic force generated between the charged portions 54 and the counter electrodes 55 and 56 in response to electric signals inputted to the driver 20, to reciprocate the sliding board 52, thereby taking out motive power from electric power. The movable member of the electromechanical transducer is not limited to one rotating around a rotating shaft, but may reciprocate like the sliding board 52.

The sliding board 52 is an example of the movable member, and is made of, for example, an aluminum or silicon substrate and supported in the box-shaped housing 51 by a movable-member supporter (not shown). The sliding board 52 can reciprocate in the direction parallel with the fixed substrate 53 (the horizontal direction or the direction of arrow A) with a predetermined distance maintained between the sliding board 52 and the fixed substrate 53 disposed at the bottom of the housing 51. In the lower surface of the sliding board 52, for example, projections 523 and recesses 524 (an example of the grooves) are formed into strips (straight lines) extending in the direction perpendicular to the moving direction of the sliding board 52, and are disposed alternately in the moving direction. It is preferred that both the projections 523 and the recesses 524 be evenly spaced and their widths be the same. Unlike the illustrated example, the recesses 524 may penetrate the sliding board 52 in the thickness direction thereof.

The charged portions 54 are thin films made of an electret material and are formed into strips so as to cover the projections 523 in the lower surface of the sliding board 52. The counter electrodes 55 and 56 are formed on the upper surface of the fixed substrate 53 into strips extending in the direction perpendicular to the moving direction of the sliding board 52, and are disposed alternately in the moving direction. It is preferred that both the counter electrodes 55 and the counter electrodes 56 be evenly spaced and their widths be the same. It is also preferred that the widths of the counter electrodes 55 and 56 be the same or substantially the same as those of the projections 523 and the recesses 524, and that the numbers of charged portions 54, counter electrodes 55 and counter electrodes 56 be equal.

The driver 20 is a circuit for driving the actuator 50 and is connected to the counter electrodes 55 and 56 through electric wiring. The driver 20 is identical in structure to that of the electromechanical transducer 1, and applies an alternating voltage to the counter electrodes 55 and 56, thereby reciprocating the sliding board 52 in the direction of arrow A inside the housing 51, as shown in FIGS. 17(B) and 17(C).

In the actuator 50 also, a cover layer similar to the above cover layer 19 (or one of the cover layers 19a to 19c) of the rotary member 12 is formed on the side walls of the recesses 524 of the sliding board 52. Accordingly, the amount of electrostatic charge of the charged portions 54 in the sliding board 52 of the actuator 50 does not substantially decrease, and this results in a highly reliable electret motor in which both weight reduction and resistance to moisture are achieved.

In the power-generating unit 30 and the actuator 50 also, as in the actuator 10' shown in FIG. 5(A), the charged portions may be formed on both sides of the rotary member 12 or the sliding board 52, and fixed substrates including counter electrodes may be placed so as to face the respective sides of the rotary member 12 or the sliding board 52.

The invention claimed is:

1. An electromechanical transducer using electrostatic interaction between a charged portion and a counter electrode to perform transduction between electric power and motive power, the electromechanical transducer comprising:
a fixed substrate;
a movable member being movable with a predetermined distance maintained between the fixed substrate and the movable member, the movable member having grooves in a surface facing the fixed substrate, the grooves being formed at intervals in a moving direction of the movable member;
charged portions formed on the surface of the movable member so as to alternate with the grooves;
counter electrodes disposed on a surface of the fixed substrate in the moving direction, the surface facing the movable member; and
a cover layer containing copper and covering at least side walls of the movable member inside the grooves.

2. The electromechanical transducer according to claim 1, wherein
the charged portions cover the surface of the movable member between the grooves, and
a base material of the movable member is not exposed between the charged portions and the cover layer.

3. The electromechanical transducer according to claim 2, wherein
the cover layer covers the side walls and the surface of the movable member, and
the charged portions are formed over the cover layer in the surface of the movable member.

4. The electromechanical transducer according to claim 1, wherein
the grooves penetrate the movable member in a thickness direction, and
the cover layer covers the side walls of the grooves throughout the thickness of the movable member.

5. The electromechanical transducer according to claim 1, wherein
the movable member is a rotary member rotatable around a rotating shaft, and
the grooves, the charged portions and the counter electrodes are radially disposed around the rotating shaft.

6. The electromechanical transducer according to claim 1, wherein
edges facing the grooves of the movable member are pointed portions projecting in a thickness direction of the movable member, and
the cover layer covers the pointed portions of the movable member.

7. An electromechanical transducer using electrostatic interaction between a charged portion and a counter electrode to perform transduction between electric power and motive power, the electromechanical transducer comprising:
a first fixed substrate;
a movable member being movable with a predetermined distance maintained between the first fixed substrate and the movable member, the movable member having grooves penetrating the movable member in a thickness direction, the grooves being formed at intervals in a moving direction of the movable member;
a plurality of pointed portions formed at edges facing the grooves on a first surface of the movable member, the first surface facing the first fixed substrate, the plurality of pointed portions projecting in a thickness direction of the movable member;
first charged portions formed on the first surface so as to be sandwiched between two adjacent pointed portions of the plurality of pointed portions;
first counter electrodes disposed on a first opposed surface of the first fixed substrate in the moving direction, the first opposed surface facing the movable member; and a cover layer covering at least side walls of the movable member and the plurality of pointed portions, the side walls being inside the grooves, and the cover layer including an insulating layer on a surface thereof.

8. The electromechanical transducer according to claim 7, wherein the cover layer contains copper and the insulating layer is copper oxide.

9. The electromechanical transducer according to claim 7, wherein the cover layer is a coating of hydrated aluminum oxide.

10. The electromechanical transducer according to claim 7, wherein the cover layer is a fluorocarbon resin film.

11. The electromechanical transducer according to claim 10, wherein the cover layer covers the side walls of the movable member and the charged portions.

12. The electromechanical transducer according to claim 7, further comprising:

a second fixed substrate being placed so as to face the first fixed substrate with the movable member in between;

second charged portions formed on a second surface of the movable member so as to alternate with the grooves, the second surface facing the second fixed substrate; and second counter electrodes disposed on a second opposed surface of the second fixed substrate in the moving direction, the second opposed surface facing the second surface of the movable member.

13. A method for manufacturing an electromechanical transducer using electrostatic interaction between a charged portion and a counter electrode to perform transduction between electric power and motive power, the method comprising the steps of:

forming grooves in a first substrate at intervals;

forming a cover layer containing copper on at least side walls of the first substrate inside the grooves;

forming charged portions on the first substrate between the grooves; and placing the first substrate so that the first substrate is movable with a predetermined distance maintained between the first substrate and a second substrate on which electrodes are disposed and that the charged portions face the electrodes.

14. The method according to claim 13, wherein the grooves and the cover layer are simultaneously formed by electrically discharge machining the first substrate.

15. The method according to claim 13, wherein the cover layer is formed by evaporating copper onto the first substrate after the grooves are formed and before the charged portions are formed.

16. The method according to claim 13, wherein the grooves are formed by stamping the first substrate, the cover layer is formed so as to cover pointed portions of the first substrate, the pointed portions being formed at edges facing the grooves and projecting in a thickness direction of the first substrate, and the charged portions are charged after the cover layer is formed.

17. A method for manufacturing an electromechanical transducer using electrostatic interaction between a charging portion and a counter electrode to perform transduction between electric power and motive power, the method comprising the steps of:

forming grooves and a plurality of pointed portions in a first substrate by stamping the first substrate, the grooves being formed so as to penetrate the first substrate in a thickness direction at intervals, the plurality of pointed portions being formed at edges facing the grooves on a first surface of the first substrate, the pointed portions projecting in a thickness direction of the first substrate;

disposing first charging portions on the first surface so as to be sandwiched between two adjacent pointed portions of the plurality of pointed portions;

forming a cover layer at least on the plurality of pointed portions and on side walls of the first substrate, the side walls being inside the grooves, and the cover layer including an insulating layer on a surface thereof;

placing the first substrate so that the first substrate is movable with a predetermined distance maintained between the first substrate and a second substrate on which first electrodes are disposed and that the first charging portions face the first electrodes; and charging the first charging portions after the cover layer is formed.

18. The method according to claim 17, wherein a layer containing copper is formed as the cover layer, and the first charging portions are burned to oxidize copper in the cover layer, thereby forming the insulating layer.

19. The method according to claim 17, wherein the first substrate is made of aluminum or an aluminum alloy, and the cover layer is formed by holding the first substrate in high-temperature water or pressurized water vapor.

20. The method according to claim 17, further comprising the steps of:

disposing second charging portions on a second surface of the first substrate between the grooves, the second surface being opposite surface of the first surface; and placing a third substrate on which second electrodes are disposed so that the third substrate faces the second substrate with the first substrate in between and that the second charging portions face the second electrodes.

* * * * *